United States Patent
Merz

(10) Patent No.: US 10,483,725 B2
(45) Date of Patent: Nov. 19, 2019

(54) CARRIER RAIL HOUSING AND ELECTRONIC MODULE WITH A CARRIER RAIL HOUSING AND CONTROL SYSTEM

(71) Applicant: Pilz GmbH & Co. KG, Ostfildern (DE)

(72) Inventor: Lothar Merz, Ostfildern (DE)

(73) Assignee: Pilz GmbH & Co. KG, Ostfildern (DE)

( * ) Notice: Subject to any disclaimer, the term of this patent is extended or adjusted under 35 U.S.C. 154(b) by 0 days.

(21) Appl. No.: 16/164,437

(22) Filed: Oct. 18, 2018

(65) Prior Publication Data

US 2019/0123521 A1    Apr. 25, 2019

(30) Foreign Application Priority Data

Oct. 23, 2017   (DE) .................. 10 2017 124 706

(51) Int. Cl.
*H01R 9/26* (2006.01)
*H02B 1/052* (2006.01)
(Continued)

(52) U.S. Cl.
CPC ......... *H02B 1/0523* (2013.01); *H01R 9/2675* (2013.01); *H01R 25/162* (2013.01);
(Continued)

(58) Field of Classification Search
CPC .......... H01R 9/2691; H01R 4/64; H01R 9/26; H01R 9/2608; H01R 25/14; H01R 25/142
(Continued)

(56) References Cited

U.S. PATENT DOCUMENTS

| | | | |
|---|---|---|---|
| 2007/0246256 A1* | 10/2007 | Eusterholz | H01R 9/2625 174/520 |
| 2016/0278228 A1* | 9/2016 | Bury | H01R 11/03 |
| 2016/0286679 A1* | 9/2016 | Bury | H05K 7/1465 |

FOREIGN PATENT DOCUMENTS

| | | |
|---|---|---|
| DE | 202014102739 U1 | 6/2014 |
| DE | 102013112099 A1 | 5/2015 |

(Continued)

OTHER PUBLICATIONS

Search Report in Corresponding European Patent Application No. 18198905, dated Mar. 14, 2019, with English Translation.

*Primary Examiner* — Abdullah A Riyami
*Assistant Examiner* — Justin M Kratt
(74) *Attorney, Agent, or Firm* — Edell, Shapiro & Finnan, LLC.

(57) ABSTRACT

A carrier rail housing comprises: a carrier rail receiving opening into which the holding legs of a carrier rail are insertable; a locking mechanism to secure the holding legs in a desired mounting position and comprising locking slides to interlock with the carrier rail housing in a locking position; a plug-in contact element arranged inside the carrier rail housing to face the carrier rail receiving opening; and a bus connector into which plug-in contacts of the plug-in contact element are insertable, the bus connector being connectable to a plug-in contact element of at least one additional carrier rail housing, wherein each of the locking slides comprises a first end that comprises a holding section that extends in sections into the carrier rail receiving opening in the locking position, so that the bus connector is secured between the holding sections of the locking slides and the plug-in contact element.

9 Claims, 18 Drawing Sheets

(51) Int. Cl.
*H05K 7/14* (2006.01)
*H01R 25/16* (2006.01)
*H01R 25/14* (2006.01)
*H01R 4/64* (2006.01)
*H01R 31/06* (2006.01)

(52) U.S. Cl.
CPC ............. *H05K 7/1478* (2013.01); *H01R 4/64* (2013.01); *H01R 9/26* (2013.01); *H01R 9/2608* (2013.01); *H01R 9/2691* (2013.01); *H01R 25/14* (2013.01); *H01R 25/142* (2013.01); *H01R 31/06* (2013.01)

(58) Field of Classification Search
USPC ........... 439/121, 110, 716, 532, 94; 174/520
See application file for complete search history.

(56) References Cited

FOREIGN PATENT DOCUMENTS

| | | |
|---|---|---|
| DE | 102013112101 A1 | 5/2015 |
| EP | 0499660 A1 | 8/1992 |
| WO | 2017153507 A1 | 9/2017 |

\* cited by examiner

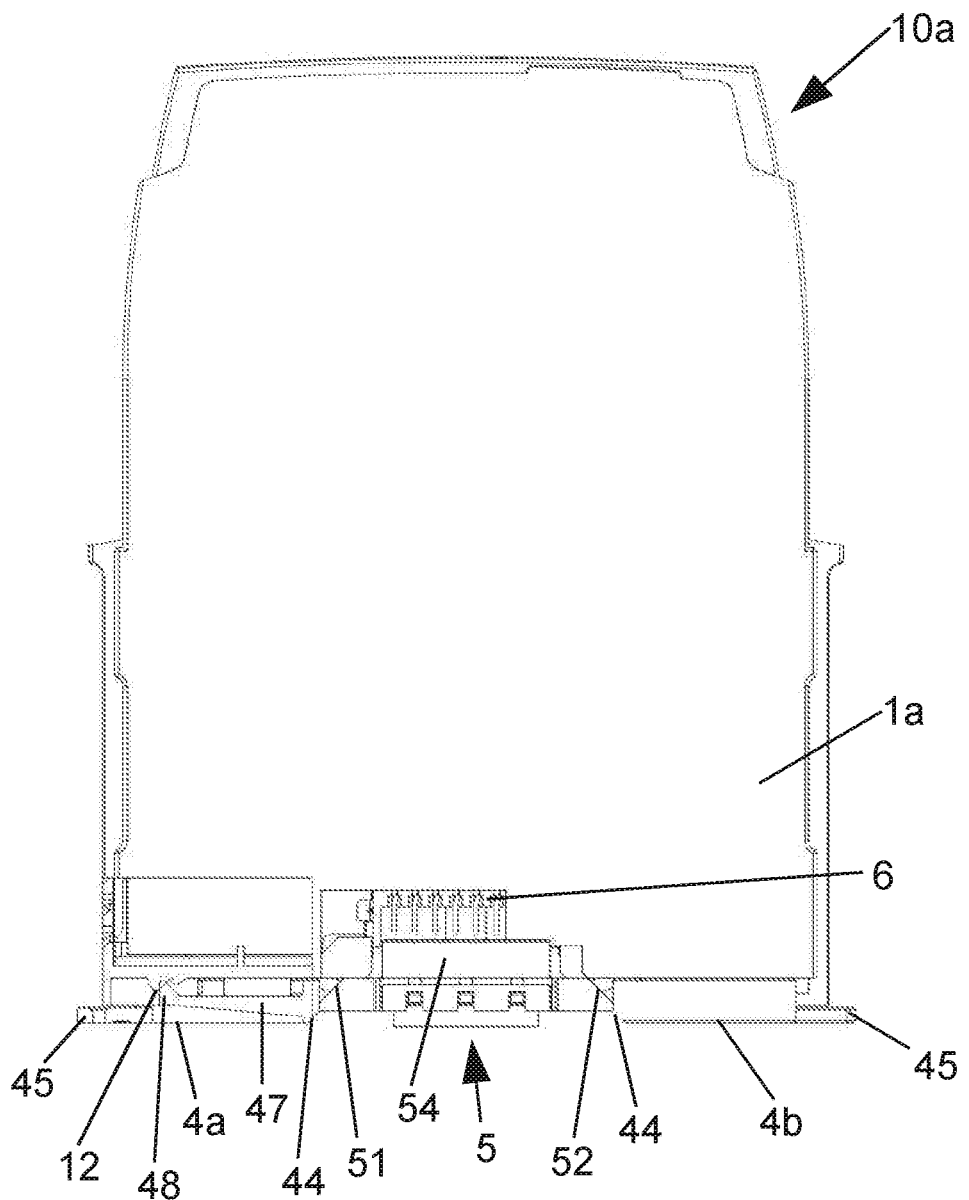

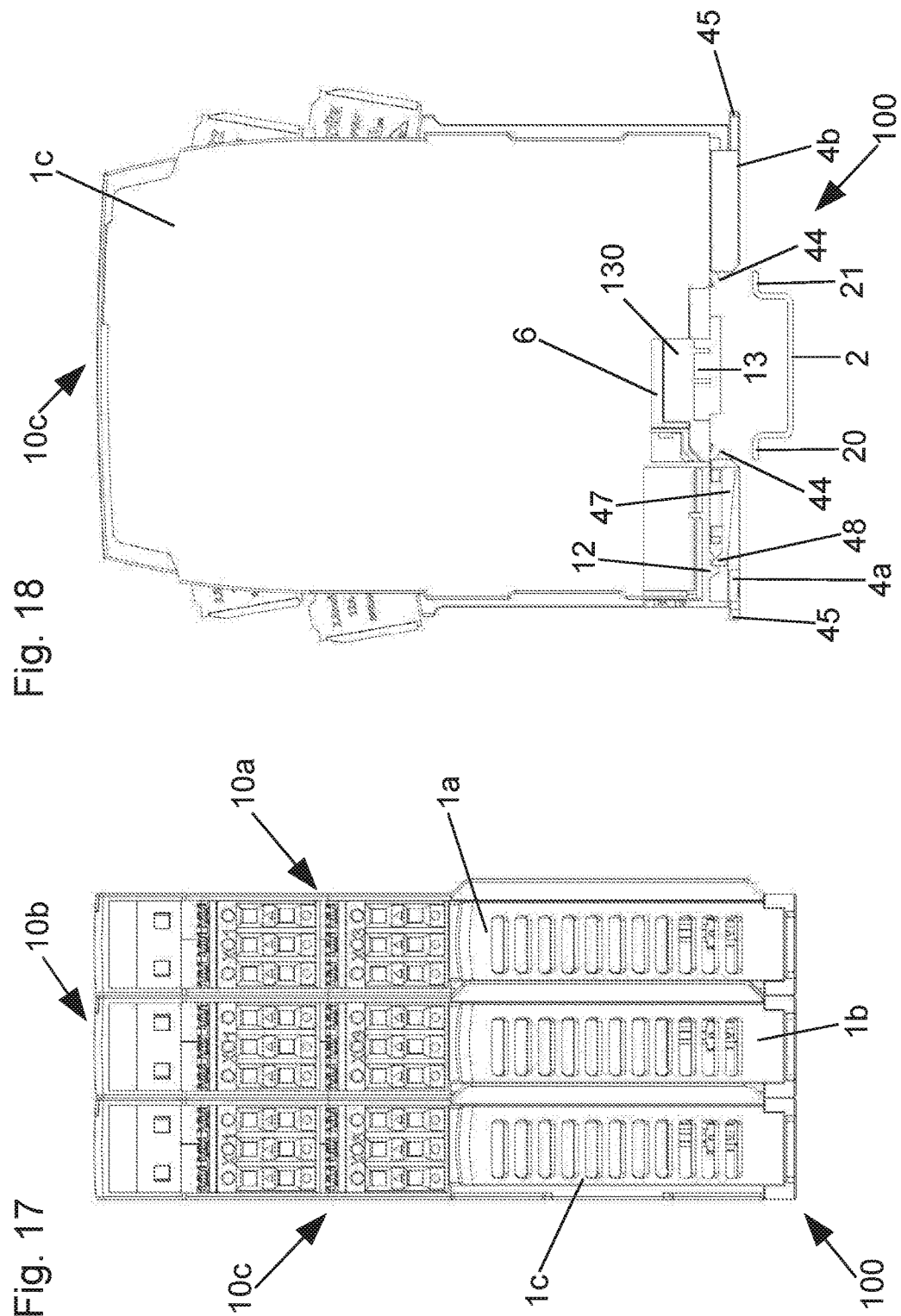

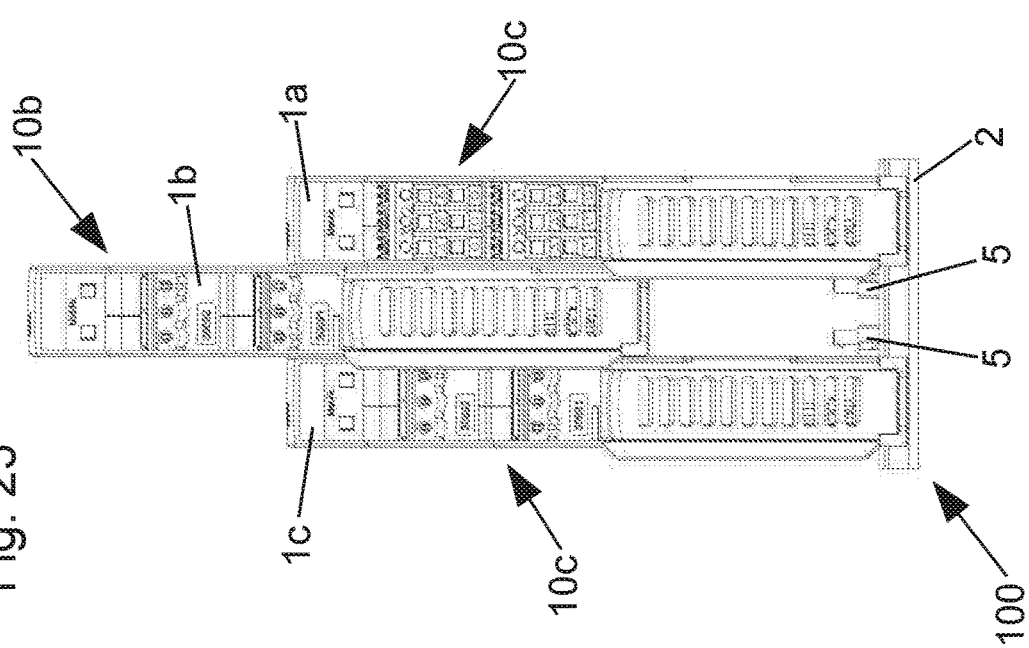
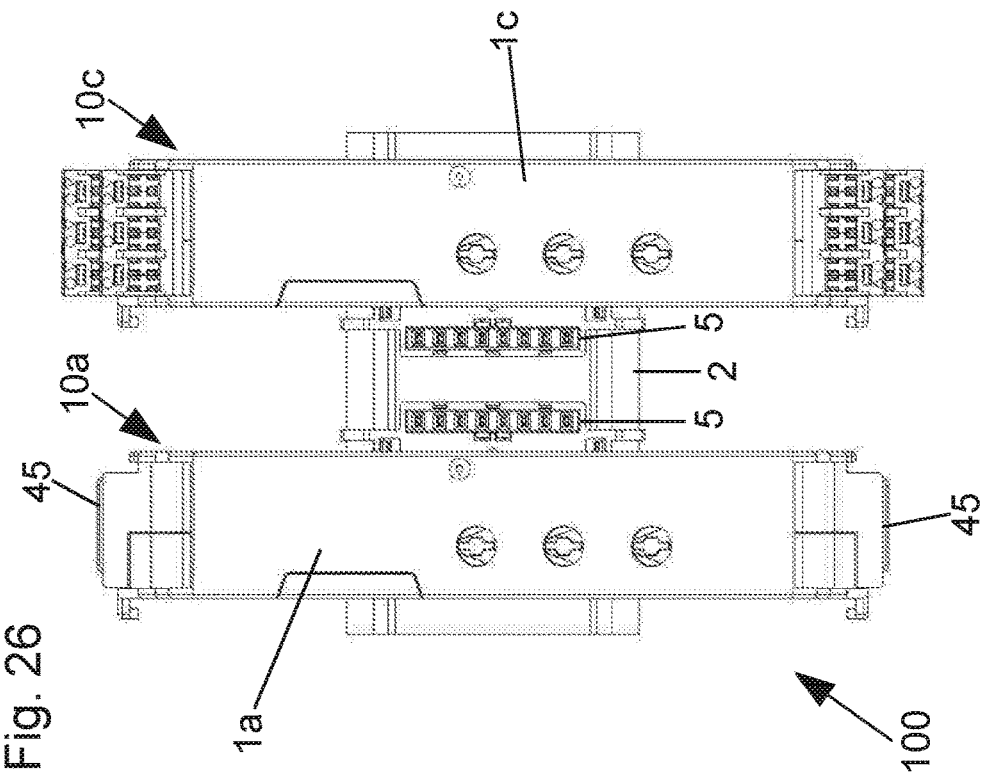

CARRIER RAIL HOUSING AND ELECTRONIC MODULE WITH A CARRIER RAIL HOUSING AND CONTROL SYSTEM

CROSS REFERENCE TO RELATED APPLICATIONS

This application claims foreign priority under 35 U.S.C. § 119(a)-(d) to Application No. DE 102017124706.8 filed on Oct. 23, 2017, the entire contents of which are hereby incorporated by reference.

TECHNICAL FIELD

The present invention relates to a carrier rail housing, suitable for attaching to a carrier rail, in particular, a DIN rail, which comprises two holding legs, which extend in the longitudinal direction and face outwards, the carrier rail housing comprising a carrier rail receiving opening, into which the holding legs of the carrier rail can be inserted, and a locking mechanism, which is designed to secure the holding legs in their desired mounting position inside the carrier rail receiving opening. In addition, the present invention relates to an electronic module, comprising a carrier rail housing, which can be attached to a carrier rail, in particular, a DIN rail. Furthermore, the present invention relates to a system, in particular, a control system, with a plurality of electronic modules, which can be attached to a carrier rail.

BACKGROUND

Systems, in particular, control systems, of the type mentioned in the introductory part are known from the prior art in a variety of embodiments that are constructed from a plurality of electronic modules in a modular fashion. The modular design of these systems offers the option of an application specific configuration, because a plurality of electronic modules can be assembled individually, in order to make the desired functionalities available to the system. Examples of such electronic modules, from which control systems with totally different functionalities can be constructed, are, among others, control modules, interface modules, field bus controllers, field bus couplers, input modules that can receive and, optionally, process input signals of one or more sensors, output modules that can emit output signals to one or more actuators connected to the electronic modules, or also combined input and output modules (so-called I/O modules).

Each of the electronic modules, from which the system is constructed, comprises a carrier rail housing that is designed such that it can be interlocked with a carrier rail, in particular, a DIN rail. The carrier rail in turn can be housed inside a switch cabinet. As a result, the electronic modules of the system can be interlocked side by side on the carrier rail. In order to enable communication between the electronic modules, the electronic modules can be connected to one another in pairs by a bus connector. Furthermore, it is possible to provide the electronic modules with an electric supply voltage via the bus connectors.

In the case of the carrier rail housings known from the prior art, a variety of fixing concepts for fixing the carrier rail housings on the carrier rail, on the one hand, and for fixing the bus connectors on the electronic modules, on the other hand, are used, so that the mounting process of the bus connectors and the mounting process of the carrier rail housings on the carrier rail are relatively complex.

SUMMARY

The object of the present invention is to provide a carrier rail housing of the type described in the introductory part and a generic electronic module such that they are much easier to mount. In addition, the object of the present invention is to provide a system, in particular, a control system that enables a simpler mounting and a particularly safe handling.

The carrier rail housing of the present invention is characterized by the feature that the carrier rail housing comprises at least one plug-in contact element, which is arranged inside the carrier rail housing in such a manner that it faces in the direction of the carrier rail receiving opening, and a number of plug-in contacts as well as at least one bus connector, into which at least some of the plug-in contacts of the plug-in contact element are inserted, wherein the bus connector can be connected to a plug-in contact element of at least one additional carrier rail housing and wherein the locking mechanism comprises two locking slides that are arranged so as to be displaceable on a mounting side of the carrier rail housing and can be interlocked with the carrier rail housing in a locking position, wherein each of the locking slides comprises a first end that comprises a holding section that extends in sections into the carrier rail receiving opening in the locking position, so that the bus connector is secured between the holding sections of the locking slides and the plug-in contact element inside the carrier rail receiving opening. The carrier rail housing of the present invention enables a particularly easy mounting process and, in addition, provides a secure hold of the bus connector on the carrier rail housing. In this way it is achieved that the bus connector is permanently connected to the relevant carrier rail housing. The mounting of the bus connector on the carrier rail housing can be carried out, for example, in an automated fashion in an assembly station, so that the assembly costs can be reduced.

In a preferred embodiment it is proposed that each of the locking slides comprises a locking element and that the carrier rail housing comprises two locking recesses, where in the locking position of the locking slides one of the locking elements engages with each of the two locking recesses. As a result, in the locking position a secure hold of the locking slides, the locking elements of which generate a corresponding holding force, is achieved on the carrier rail housing.

In a particularly preferred embodiment it can be provided that the locking elements are designed as bending beams that extend from the holding section in the direction of a second end of the relevant locking slide and comprise a locking projection that engages with the locking recess, associated with the locking slide, in the locking position. This embodiment has the advantage that the locking elements, designed as bending beams, are designed to be mechanically very robust and can reliably provide the holding forces.

In one advantageous embodiment each of the bending beams can be designed such that when the locking slide is displaced outwards away from the carrier rail receiving opening, the bending beam generates in interaction with the locking recess, with which the locking projection engages, a reset force that acts on the locking slide in the direction of the carrier rail receiving opening. In this way, it is achieved that the locking slides automatically spring back after the bus connector has been mounted, so that the holding sections extend again in sections into the carrier rail receiving opening and, in so doing, guarantee the secure hold of the bus connector.

In a particularly advantageous embodiment, there is the possibility that the bus connector comprises a base body with two mutually opposite ends, on each of which an inclined surface is formed, where in this case the inclined surfaces are configured so as to move the locking slides outwards when the bus connector is inserted into the carrier rail receiving opening of the carrier rail housing. In other words, when the bus connector is inserted into the carrier rail receiving opening, the locking slides are automatically moved outwards and, thus, avoid the bus connector.

In a preferred embodiment, there is the possibility that the holding legs extend between the bus connector and the holding sections of the locking slides in the desired mounting position of the carrier rail. As a result, a particularly firm hold of the carrier rail housing on the carrier rail is achieved. In addition, it is possible to ground the plug-in contact element, which is disposed inside the carrier rail housing, on the carrier rail.

In order to be able to transfer the locking slides in a simple way out of their locking position into an unlocking position, in which they are no longer interlocked with the carrier rail housing, it is proposed in a particularly preferred embodiment that each of the locking slides comprises a handling section that is designed on a second end that is opposite the first end.

An inventive electronic module comprises a carrier rail housing that can be attached to a carrier rail, in particular, a DIN rail. The electronic module of the present invention can be mounted very easily on the carrier rail and can be mechanically or electrically connected by the bus connector to one or more electronic modules in a particularly reliable way and can be combined to form a system, in particular, a control system. Inside the carrier rail housing of the electronic module there is housed at least one printed circuit board with electronic and/or electromechanical components that make specific functions available to the electronic module.

An inventive system, in particular, a control system, which comprises a plurality of electronic modules, is electrically and mechanically connected to an adjacent electronic module by the bus connector. The electronic modules, from which the inventive system, which can be, in particular, a control system, can be, inter alia, control modules, interface modules, field bus controllers, field bus couplers, input modules, which can receive and optionally process input signals of one or more sensors, output modules, which can emit output signals to one or more actuators connected to the electronic modules, or also combined input and output modules (so-called I/O modules). Thus, the inventive system, in particular, a control system, can be modularly constructed from a plurality of electronic modules, where in this case preferably at least n−1 electronic modules can be designed from a total number n of electronic modules of the system, so that adjacent electronic modules can be connected to one another by the bus connectors, which are permanently attached to the carrier rail housings. This modular design of the system offers the option of an application specific configuration in a particularly advantageous way, because a plurality of electronic modules can be already assembled individually at the manufacturer, in order to make in this way the desired functionalities available to the system, in particular, to the control system.

The assembly of the individual electronic modules into a deliverable system can be automated in an advantageous way. Following completion of the assembly process of the electronic modules at the manufacturer, the system of the present invention forms a stable unit that is ready to ship and that can be easily mounted on a carrier rail that can be disposed, for example, inside a switch cabinet. The connection of the electronic modules to one another is so stable that the entire handling of the system from the pre-assembly at the manufacturer to the final assembly on the carrier rail can take place without the use of an additional support structure to hold the electronic modules. As a result, the system that is already pre-configured at the manufacturer can be fixed on the carrier rail as a unit without a disassembly into the individual electronic modules. After the system has been mounted on the carrier rail, it is also possible in an advantageous way to disassemble again individual electronic modules without having to remove the entire system from the carrier rail for this purpose. In this case the two locking slides of the electronic module to be removed from the system are slid outwards and transferred into an unlocking position, in which they no longer lock the carrier rail housing to the carrier rail. At the same time the bus connectors of one or more adjacent electronic modules are still held by the electronic modules.

Preferably, one of the electronic modules can form a final module of the system and can comprise a termination plug. The termination plug, which can be connected to pin contacts of the pin contact element of the relevant electronic module, can be designed with or without electrical function.

BRIEF DESCRIPTION OF THE DRAWINGS

Other features and advantages of the present invention will become apparent from the following description of preferred exemplary embodiments with reference to the accompanying drawings.

FIG. 9b is a side view of the electronic module during the mounting process of the bus connector;

FIG. 11 is a plan view of the electronic module in accordance with FIG. 10a;

FIG. 17 is a plan view of the system in accordance with FIG. 16;

FIG. 18 is a side view of the system in accordance with FIG. 16 prior to the mounting process on a carrier rail;

FIG. 25 is a plan view of the system in accordance with FIG. 24 during the disassembly of one of the electronic modules;

FIG. 26 is a frontal view of the system after the disassembly of the electronic module.

DETAILED DESCRIPTION

Figure 1:
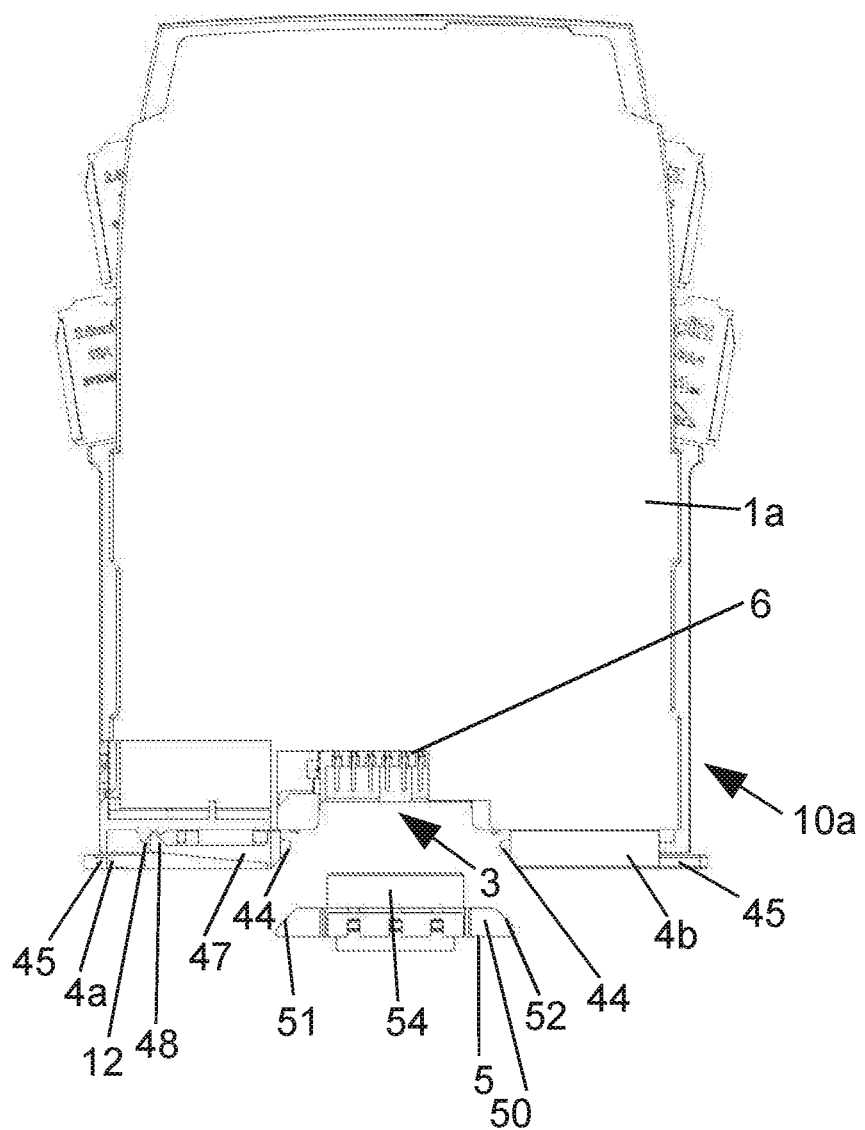
FIG. 1 is a side view of an electronic module with a carrier rail housing, which is designed in accordance with a preferred exemplary embodiment of the present invention, prior to the mounting process of a bus connector on the carrier rail housing.
Figure 3:
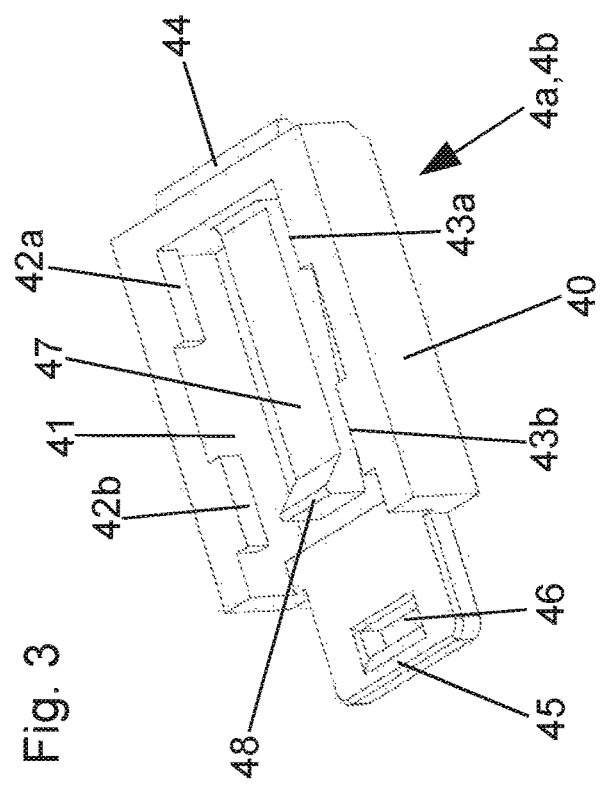
FIG. 3 is a perspective view of a locking slide, which can be attached to a mounting side of the carrier rail housing.
Figure 2:
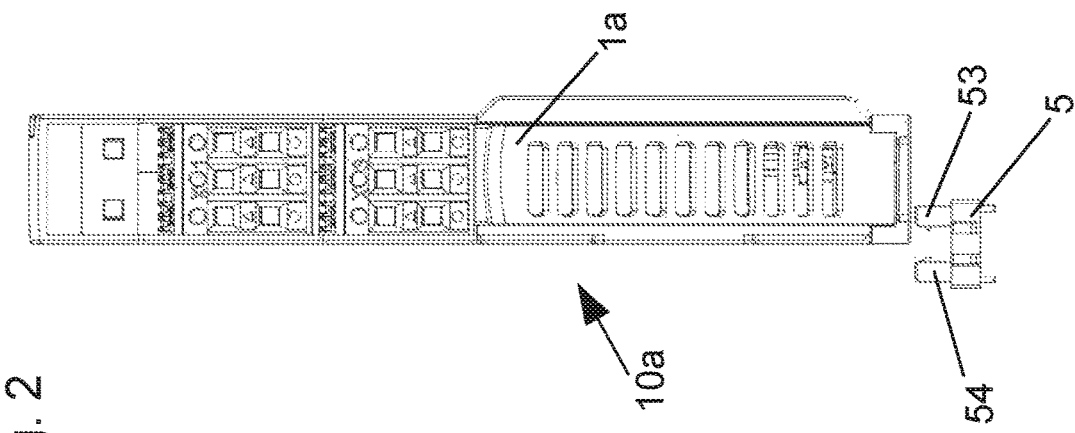
FIG. 2 is a plan view of the electronic module in accordance with FIG. 1.

With reference to FIGS. 1 and 2, an electronic module 10a is shown therein that comprises a carrier rail housing 1a, which is designed in accordance with a preferred exemplary embodiment of the present invention. The carrier rail housing 1a is designed such that it can be attached to a carrier rail 2, which is preferably a DIN rail with a hat shaped profile, as can be seen, for example, in FIG. 18, and can be interlocked with the carrier rail. For this purpose the carrier rail housing 1a comprises a carrier rail receiving opening 3 that is formed and dimensioned such that during the mounting process of the carrier rail housing 1a, the carrier rail 2 can be received in sections therein and can be interlocked. In order to be able to fix the carrier rail housing 1a on the carrier rail 2 in a locking manner, two locking slides 4a, 4b, which are guided in a manner that allows them to be moved relative to the carrier rail housing 1a, are attached to a housing side of the carrier rail housing 1a, where in this case the housing side faces the carrier rail 2 during the mounting process and which shall also be referred to herein as the mounting side. In order to illustrate the details of the locking slide 4a, shown on the left side in FIG. 1, a portion of this locking slide 4a was very deliberately cut away in the illustration according to FIG. 1 and also in the other figures.

With reference to FIGS. 3 and 6 to 8, the design details of these two locking slides 4a, 4b shall be explained in more detail below. In this exemplary embodiment both locking slides 4a, 4b are designed identically and comprise, as can be seen, in particular, in the perspective view in accordance with FIG. 3 and in the detail view in accordance with FIG. 6, two inwards extending holding projections 42a, 42b, 43a, 43b on each of the two longitudinal sides 40, 41 of the locking slides. For each of these two locking slides 4a, 4b, the carrier rail housing 1a comprises guides 70a, 70b, 71a, 71b which correspond with the holding projections 42a, 42b, 43a, 43b of the relevant locking slide 4a, 4b, on the two mutually opposite ends of the mounting side. These guides 70a, 70b, 71a, 71b are formed and dimensioned such that one of the holding projections 42a, 42b, 43a, 43b can be received in one of the guides 70a, 70b, 71a, 71b. In this way it can be achieved that the locking slides 4a, 4b are guided in a manner that allows them to be moved in the guides 70a, 70b, 71a, 71b. The mechanism that produces the guide of the locking slides 4a, 4b, can be designed in a different way.

Furthermore, each of the two locking slides 4a, 4b comprises a first end that extends in sections into the carrier rail receiving opening 3 of the carrier rail housing 1a and forms a holding section 44 of the locking slide 4a, 4b in the desired mounting position of the relevant locking slide 4a, 4b. On a second end of the two locking slides 4a, 4b, which is opposite the first end, a handling section 45 is designed with an engagement opening 46. Furthermore, a bending beam 47 is designed on a region of the holding section 44 that faces the second end and, thus, the handling section 45. The bending beam extends between the two longitudinal sides 40, 41 of the locking slide 4a, 4b in the longitudinal direction and comprises on its free end a locking projection 48 that faces the mounting side of the carrier rail housing 1a.

Two locking receptacles 12 (or abutments in an alternative embodiment), each of which is associated with one of the two locking slides 4a, 4b are designed on the mounting side of the carrier rail housing 1a. In FIG. 1 one of these two locking receptacles 12 that is associated with the locking slide 4a on the left side can be seen. Each of the two locking receptacles 12 is arranged on the mounting side of the carrier rail housing 1a in such a way and is formed such that it can interact with the locking projection 48 of the bending beam 47 of the locking slide 4a, 4b associated with the relevant locking receptacle 12. Due to the engagement of the locking projections 48 with the associated locking receptacles 12 the locking slides 4a, 4b can be fixed in a locking manner on the mounting side of the carrier rail housing 1a in a locking position. The bending beams 47 of the locking slides 4a, 4b generate a corresponding holding force in the locking position of the locking slides 4a, 4b, so that the locking projections 48 can be held in the locking receptacles 12. Other details of the function of the two locking slides 4a, 4b are explained in even more detail below.

At least one printed circuit board with electronic and/or electromechanical components, which provide the electronic module 10a with certain functions, is housed inside the carrier rail housing 1a. Examples of such electronic modules 10a, 10b, 10c, from which the system 100 can be configured, are, among others, control modules, interface modules, field bus controllers, field bus couplers, input modules that can receive and, optionally, process input signals of one or more sensors, output modules that can emit output signals to one or more actuators connected to the electronic modules, or also combined input and output modules (so-called I/O modules). A system 100, in particular, a control system, can be constructed from a plurality of electronic modules 10a, 10b, 10c in a modular fashion. The modular design of the system 100 offers the option of an application specific configuration in a particularly advantageous way, because a plurality of electronic modules 10a, 10*b*, 10*c* can be assembled individually, in order in this way to make the desired functionalities available to the system 100.

Figure 4:
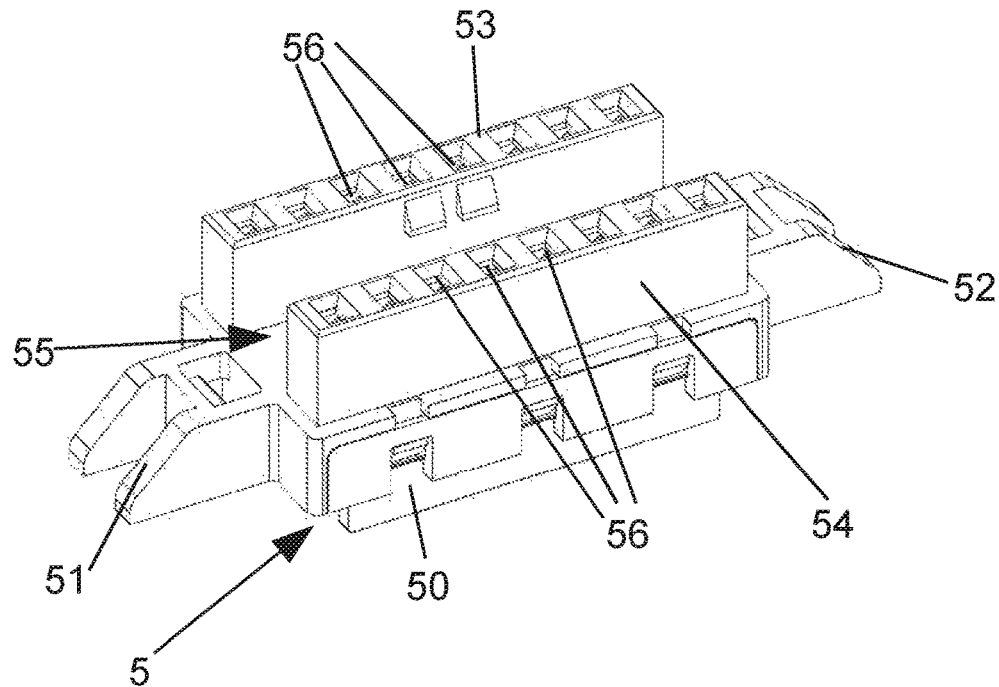
FIG. 4 is a perspective view of the bus connector.
Figure 5:
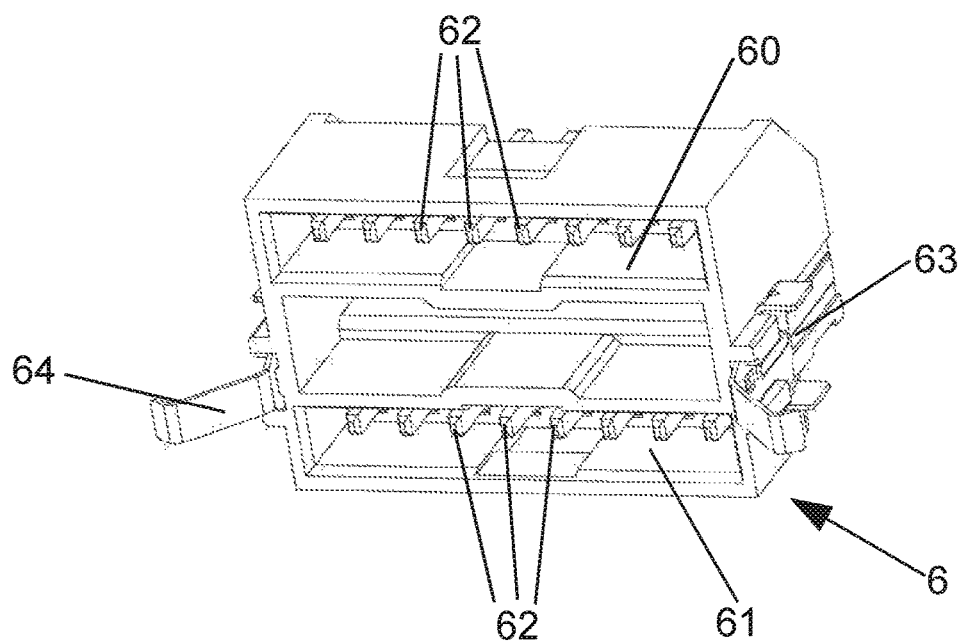
FIG. 5 is a perspective view of a plug-in contact element.
Figure 6:
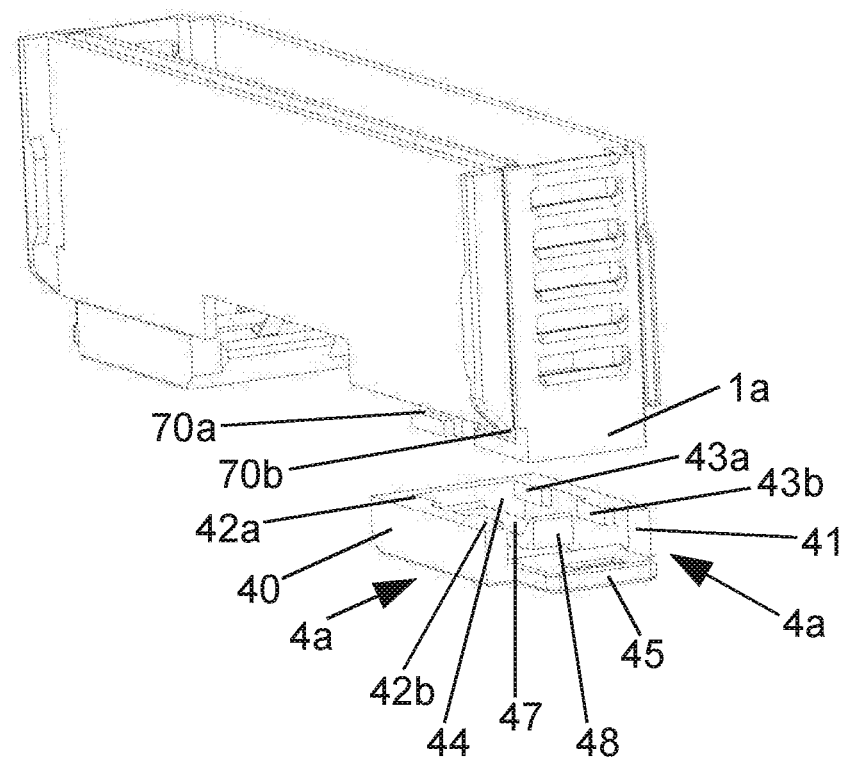
FIG. 6 is a perspective, exploded view of a detail illustrating the details of the attachment process of the locking slide on the mounting side of the carrier rail housing.
Figure 7:
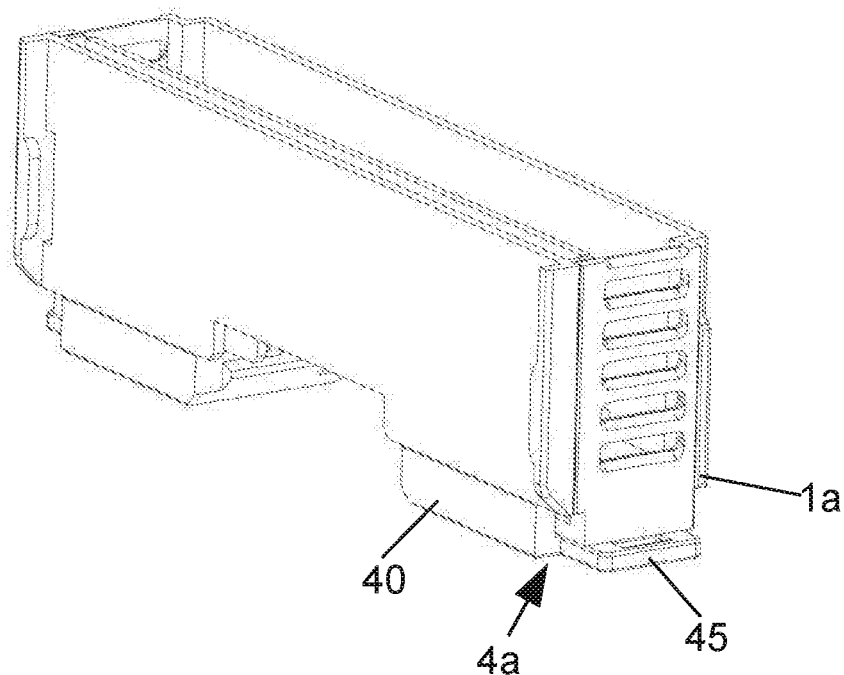
FIG. 7 is a perspective view of a detail that shows the locking slide after having been mounted on the carrier rail housing.
Figure 8:
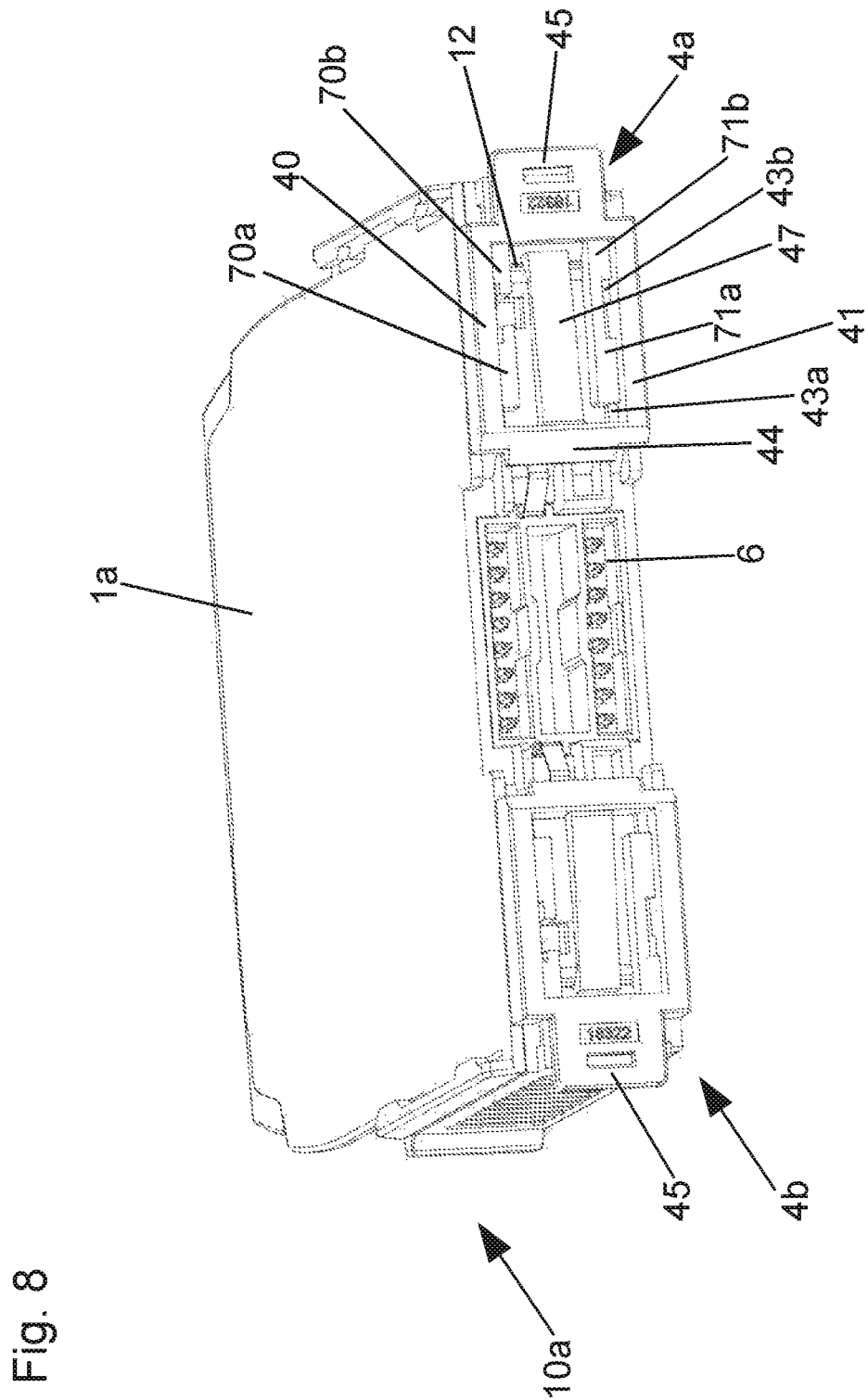
FIG. 8 is a perspective view of the carrier rail housing after the locking slides have been mounted, as seen from a mounting side.

In order to be able to connect electrically and, in addition, also mechanically a first electronic module 10*a* to a second electronic module 10*b*, the mechanical construction of which is identical to that of the first electronic module 10*a*, in a reliable way, the first carrier rail housing 1*a* is equipped with a bus connector 5 and with a plug-in contact element 6, both of which are shown in detail in FIG. 4 and FIG. 5. As can be seen in FIG. 5, the plug-in contact element 6, which is accommodated inside the first carrier rail housing 1*a*, comprises two rows of plug-in contacts 60, 61 with a number of plug-in contacts 62, which face in the direction of the carrier rail receiving opening 3. In the present embodiment a total of eight plug-in contacts 62 are provided in each of the two rows of plug-in contacts 60, 61. In addition, a grounding spring 63, 64 is attached to each of the two mutually opposite end faces of the plug-in contact element 6. A plug-in contact element 6, which is designed to match, is also housed inside the carrier rail housing 1*b* of the second electronic module 10*b*.

The bus connector 5, which is shown in FIG. 4 and connects the plug-in contact elements 6 of the two adjacent electronic modules 10*a*, 10*b* to one another, comprises a base body 50 with two mutually opposite ends, on each of which an inclined surface 51, 52 is formed. Furthermore, the bus connector 5 comprises two rows of connecting sockets 53, 54, which extend parallel to one another and are spaced apart from one another by an interspace 55. In the present embodiment each of the two rows of connecting sockets 53, 54 comprises eight connecting sockets 56. In other words, the number of connecting sockets 56 in each of the two rows of connecting sockets 53, 54 corresponds, therefore, to the number of plug-in contacts 62 in the two rows of plug-in contacts 60, 61 of the plug-in contact element 6.

In order to connect the carrier rail housings 1*a*, 1*b* of two adjacent electronic modules 10*a*, 10*b* to one another, the plug-in contacts 62 of a first row of plug-in contacts 60 of the plug-in contact element 6 of the first carrier rail housing 1*a* are plugged into the connecting sockets 56 of the first row of connecting sockets 53 of the bus connector 5. Furthermore, the plug-in contacts 62 of a second row of plug-in contacts 61 of the plug-in contact element 6 of the second carrier rail housing 1*b* are plugged into the connecting sockets 62 of the second row of connecting sockets 54 of the bus connector 5. The bus connector 5 enables, in particular, a data communication between the two electronic modules 10*a*, 10*b* that are arranged adjacent to one another.

Figure 9A:
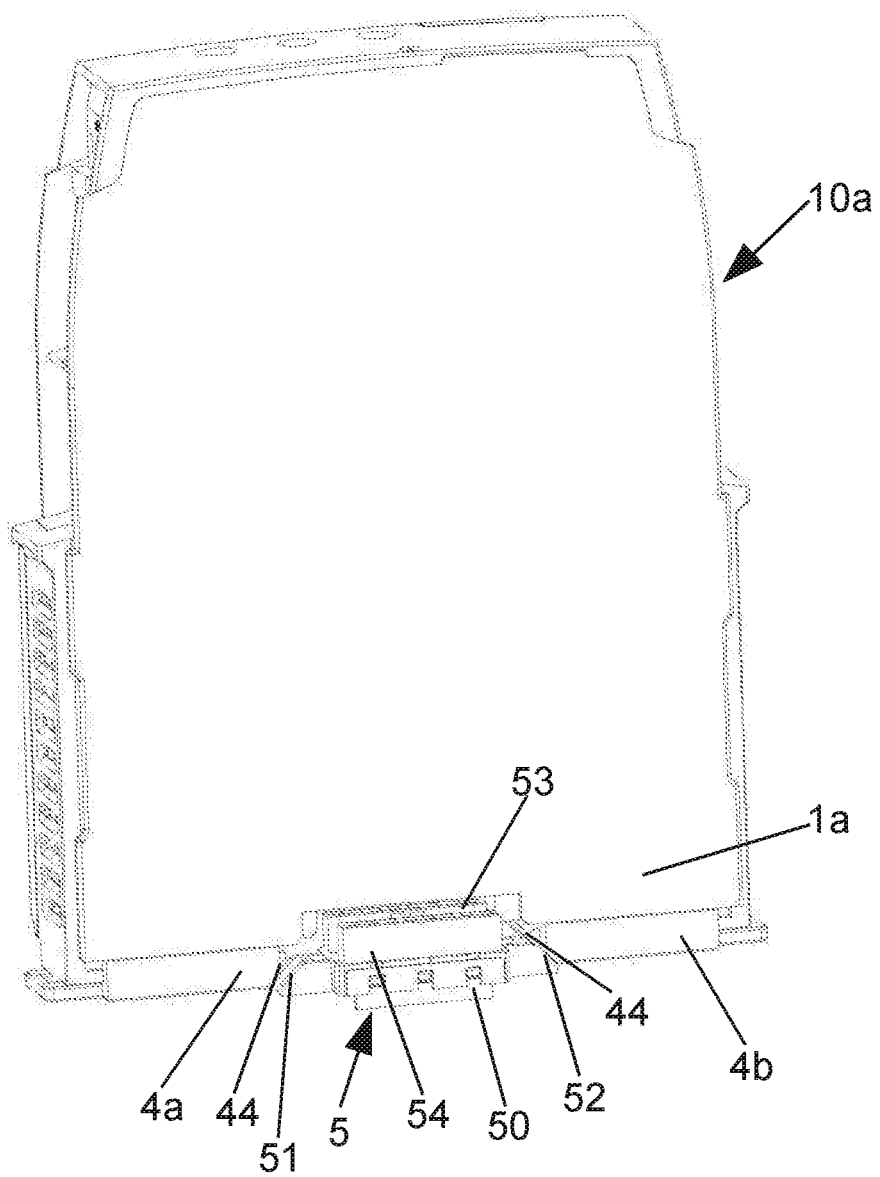
FIG. 9a is a perspective view that shows the bus connector during the mounting process on the carrier rail housing.
Figure 9C:
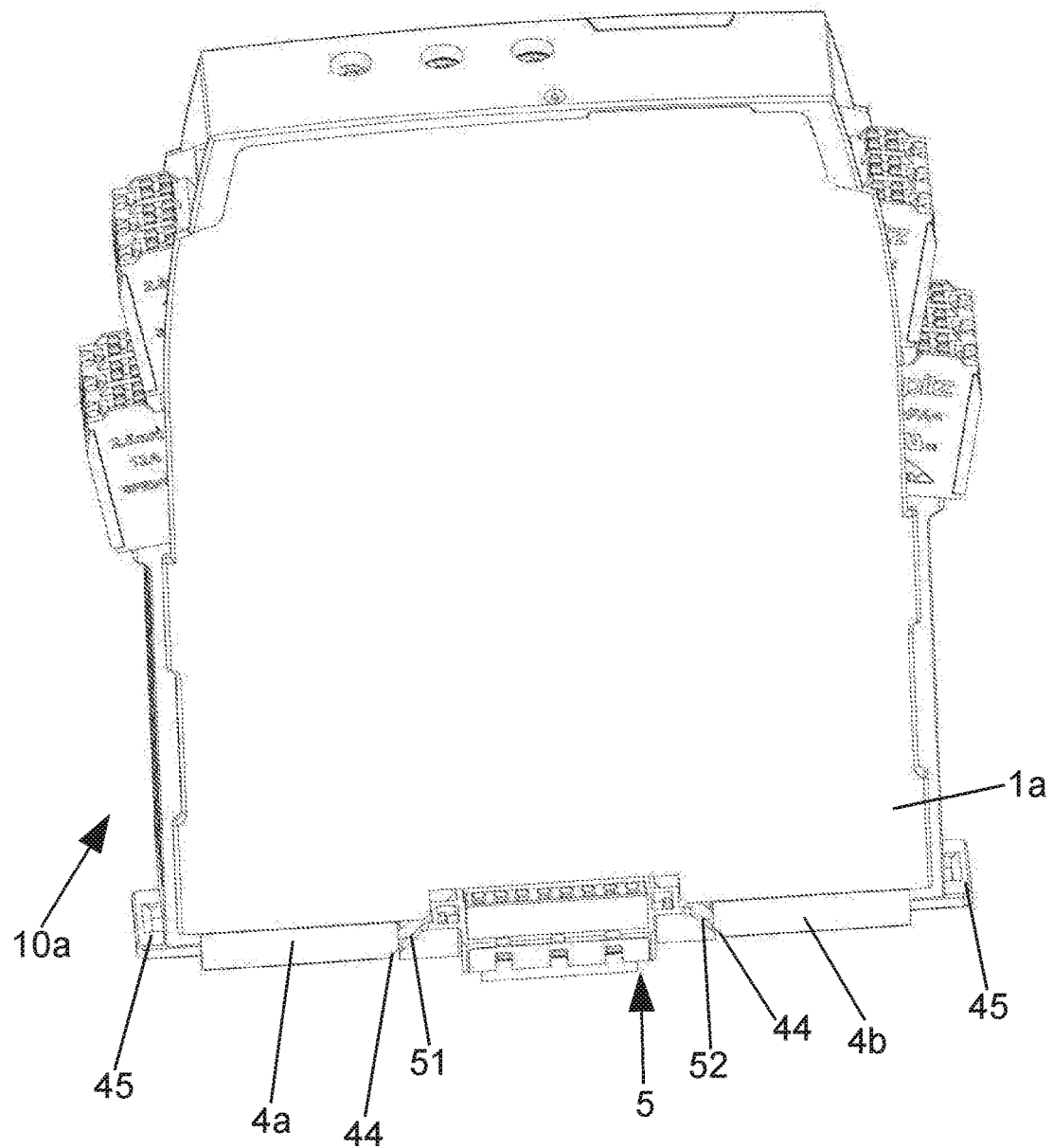
FIG. 9c is an additional perspective view that shows the bus connector during the mounting process on the carrier rail housing.

With reference to FIGS. 1, 9*a* to 11, the details of the mounting process of the bus connector 5 and the mechanical connection of the bus connector 5 to the carrier rail housing 1*a* of the first electronic module 10*a* shall be explained in greater detail below. As can be seen in FIGS. 1 and 9*a*, the bus connector 5 is inserted from the carrier rail side into the carrier rail receiving opening 3 of the relevant carrier rail housing 1*a*. It is apparent from FIGS. 9*b* and 9*c* that during the mounting process each of the two outer inclined surfaces 51, 52 of the bus connector 5 presses against the holding section 44 of one of the two locking slides 4*a*, 4*b*. As a result, the locking slides 4*a*, 4*b* are moved outwards in the axial direction and avoid the bus connector 5 and, in so doing, release the way for the bus connector 5. This situation can be seen in FIGS. 9*b* and 9*c*.

Figure 10A:
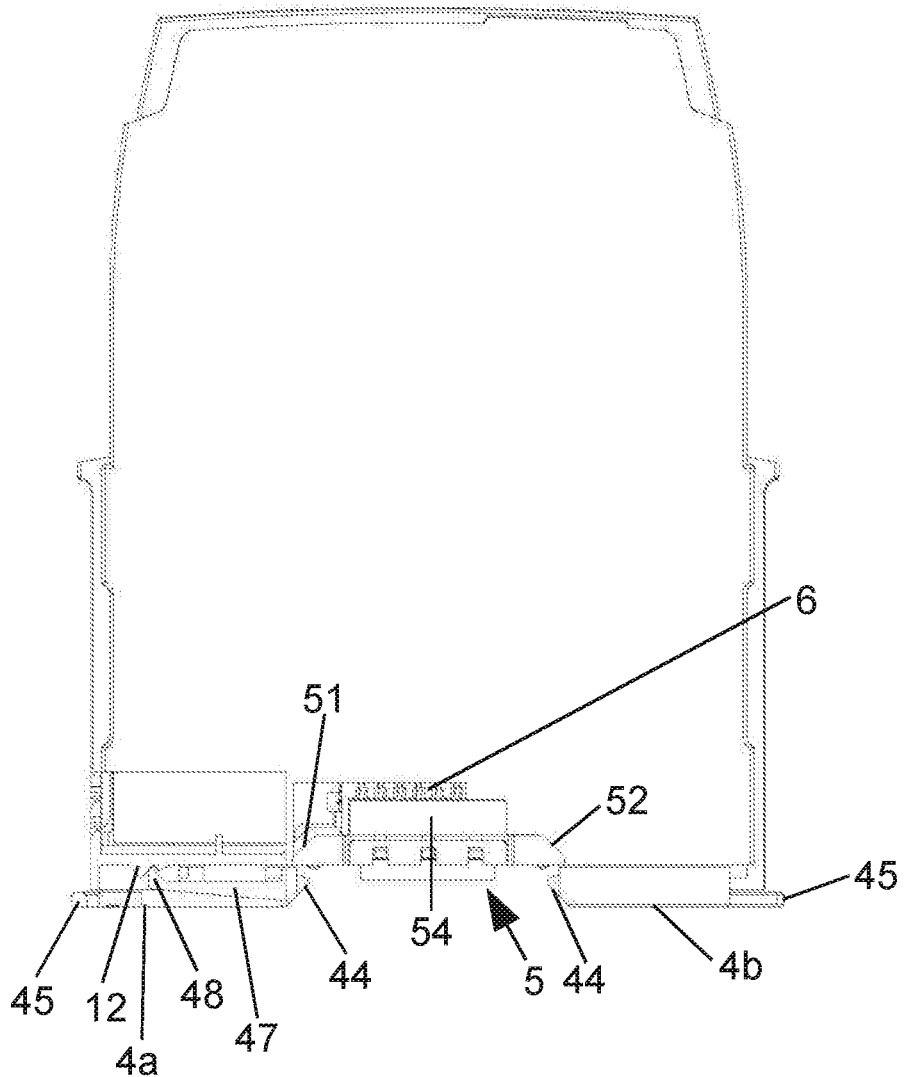
FIG. 10a is a side view of the electronic module after the mounting process of the bus connector.
Figure 10B:
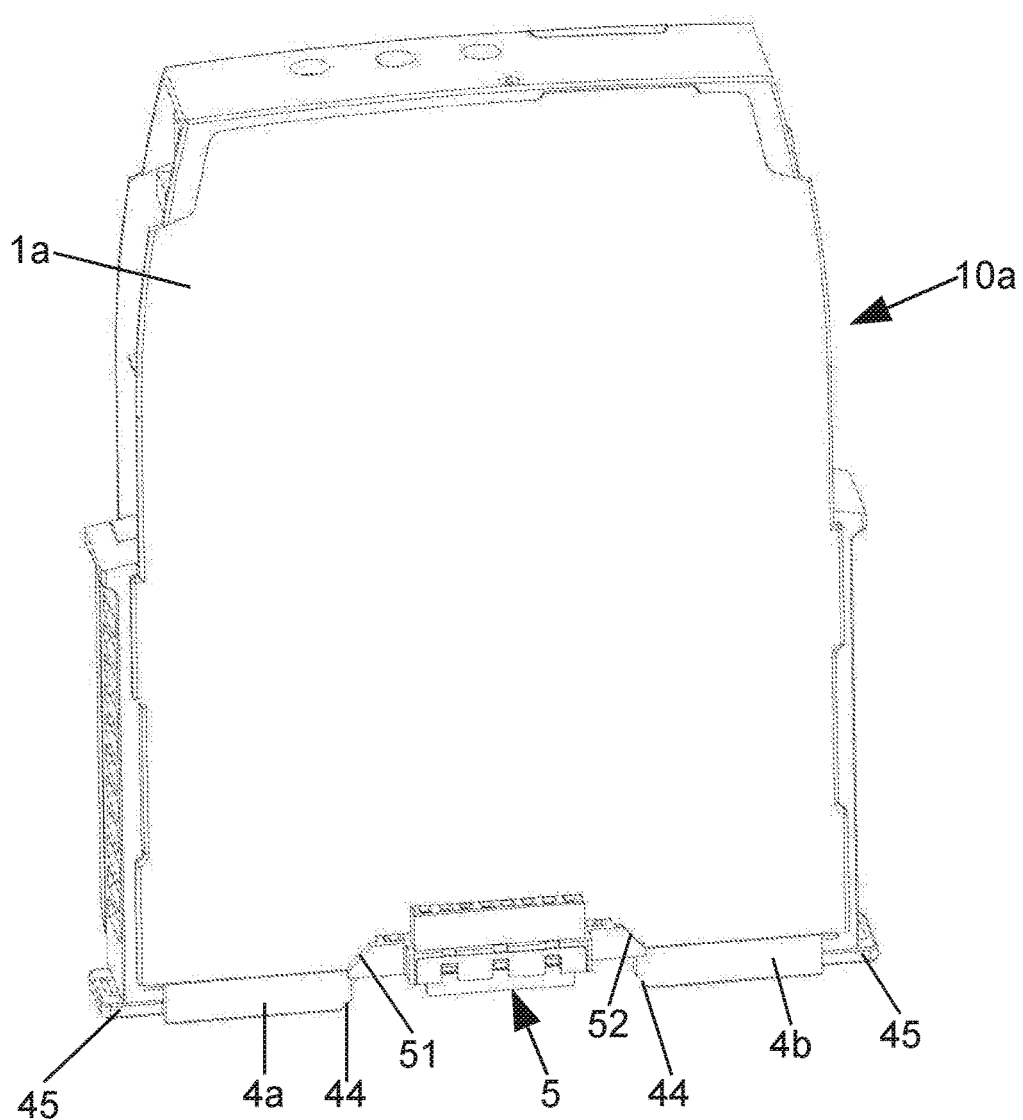
FIG. 10b is an additional perspective view that shows the bus connector after the mounting process on the carrier rail housing.
Figure 12:
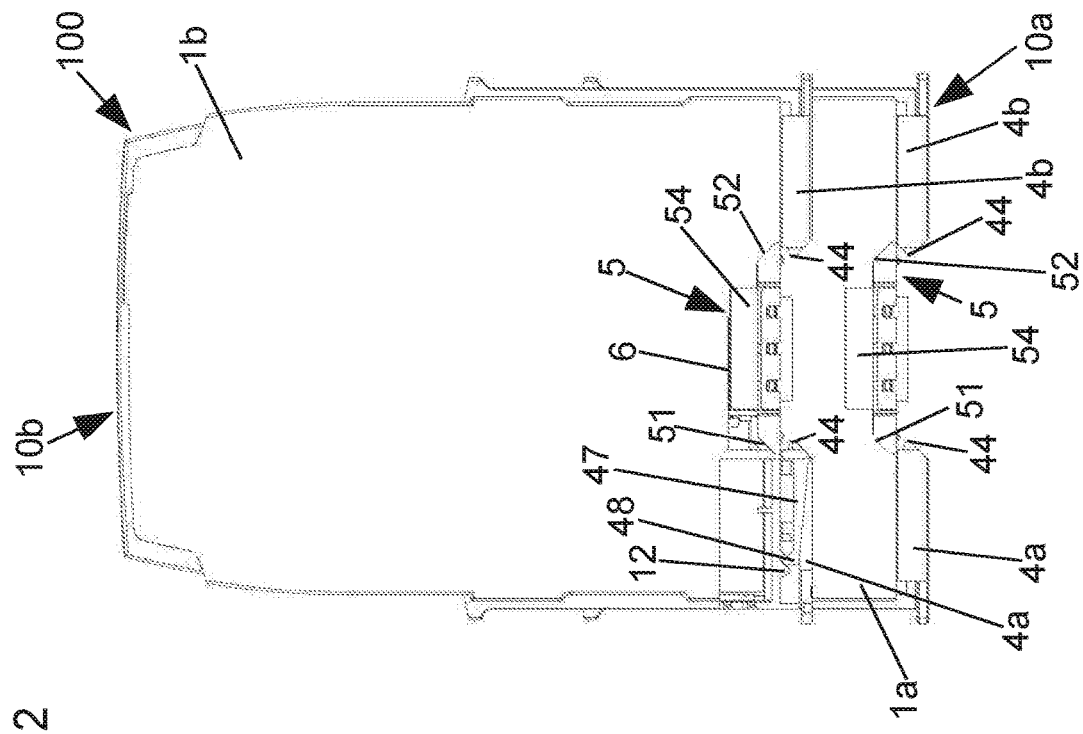
FIG. 12 is a side view of a system, in particular, a control system, with a plurality of electronic modules during the mounting process of a second electronic module on a first electric module.
Figure 11:
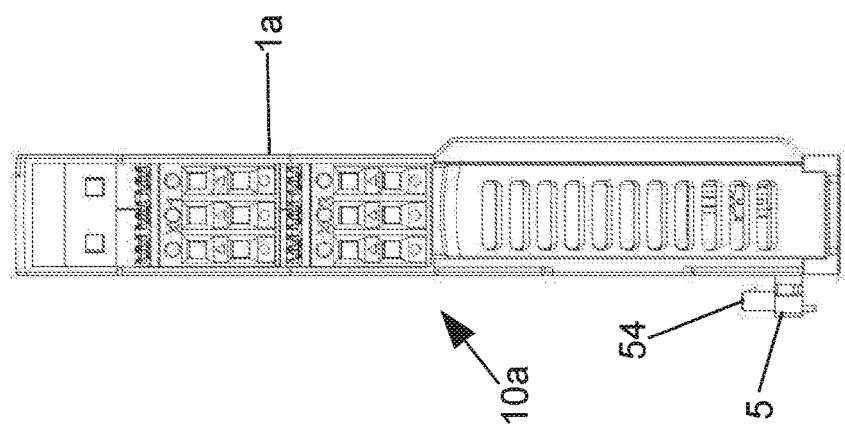

In addition, a slight deformation of the bending beams 47 is associated with this displacement movement of the two locking slides 4*a*, 4*b* to the exterior. During the deformation the locking projections 48 are firmly pressed into the locking receptacles 12 on the mounting side of the carrier rail housing 1 and, thus, are still in engagement with the locking receptacles. This deformation of the bending beams 47 of the two locking slides 4*a*, 4*b* generates a reset force, which acts in the direction of the carrier rail receiving opening 3. As soon as the bus connector 5 has passed the two locking slides 4*a*, 4*b* and is located in its desired mounting position, in which the plug-in contacts 62 of the first row of plug-in contacts 60 of the plug-in contact element 6 are plugged into the connecting sockets 56 of the first row of connecting sockets 53 of the bus connector 5, the locking slides 4*a*, 4*b* move automatically again in the direction of the carrier rail receiving opening 3 due to the reset force acting on the locking slides. As can be seen in FIGS. 10*a* and 10*b*, in the desired mounting position of the bus connector 5 the holding sections 44 on the free ends of the locking slides 4*a*, 4*b* extend beyond the free ends of the bus connector 5 such that the bus connector 5 is fixed in its desired mounting position by the two locking slides 4*a*, 4*b*. In this way it is achieved that bus connector 5 is permanently connected to the relevant carrier rail housing 1*a*. The mounting of the bus connector 5 on the carrier rail housing 1*a* can take place in an assembly station, for example, in an automated way.

With reference to FIGS. 12 to 17 the configuration of a system 100, in particular, a control system, which comprises a total of three electronic modules 10*a*, 10*b*, 10*c*, shall be explained in more detail below. In a first assembly step, which is shown in FIGS. 12 to 15, a second electronic module 10*b* is connected electrically and mechanically to a first electronic module 10a. Both electronic modules 10*a*, 10*b* are equipped with a plug-in contact element 6 of the type described above and with a bus connector 5, which is mounted on the carrier rail housings 1*a*, 1*b* of the electronic modules 10*a*, 10*b* in the manner explained above and is held in its desired mounting position with the aid of the locking slides 4*a*, 4*b* of the relevant carrier rail housings 1*a*, 1*b*. The plug-in contact elements 6 and the bus connectors 5 can be designed, in particular, in accordance with the CAN bus standard. Moreover, an electric supply voltage can also be transmitted by the plug-in connections from the first electronic module 10a to the second electronic module 10*b* and from the second electronic module also to the third electronic module 10*c* (and, if desired, to other electronic modules) for the operation thereof. Furthermore, it is also conceivable that these plug-in connections can be used to provide electric supply voltages in order to operate the sensors and/or actuators connected to the electronic modules 10*b*, 10*c*; and the electric supply voltages can be tapped by the corresponding connecting sockets at the electronic modules 10*b*, 10*c*.

Figure 14:
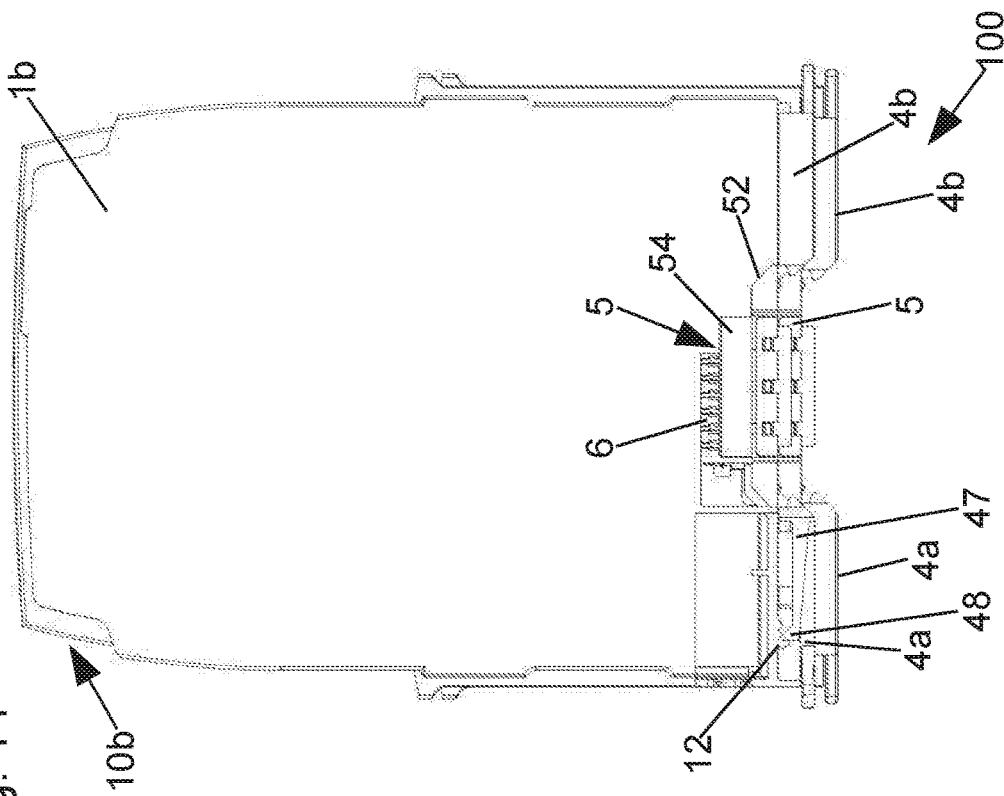
FIG. 14 is an additional side view of the system in accordance with FIG. 12 during the mounting process of the second electronic module.
Figure 13:
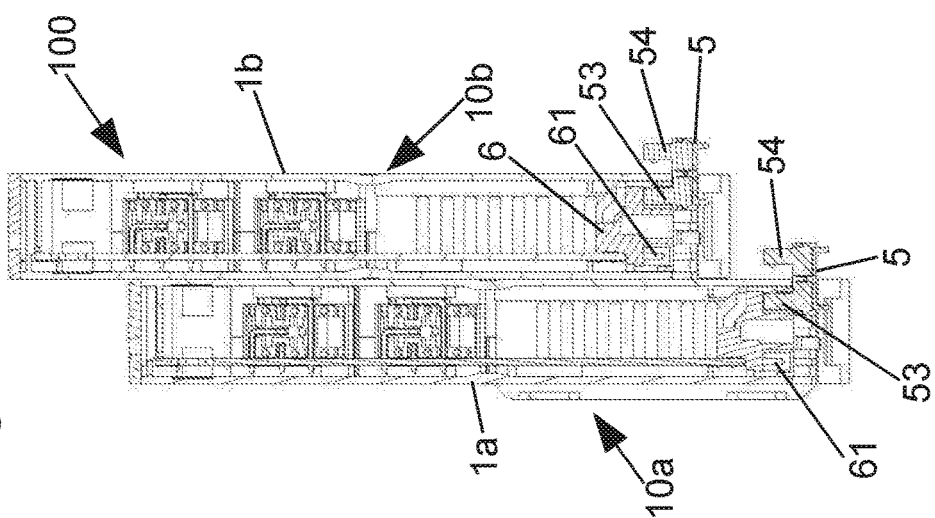
FIG. 13 is a sectional view of the system in accordance with FIG. 12.
Figure 16:
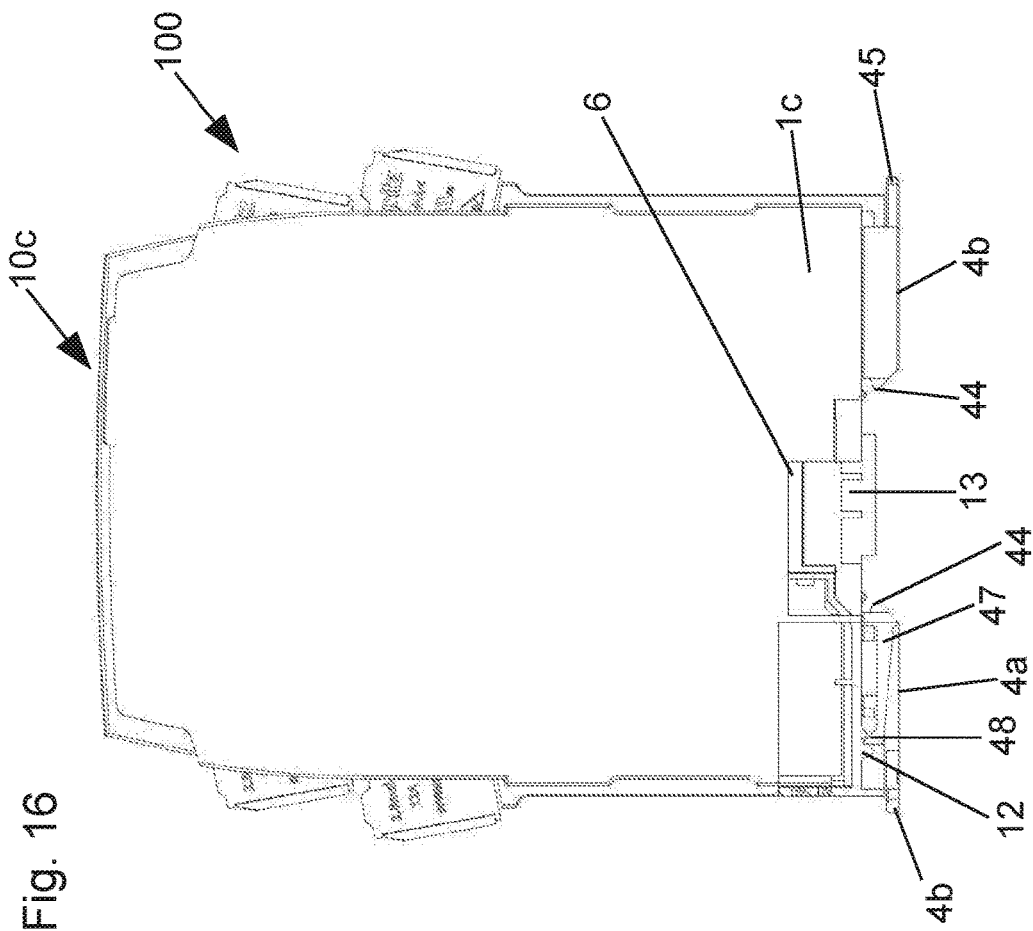
FIG. 16 is a side view of the system after the mounting process of a third electronic module.
Figure 15:
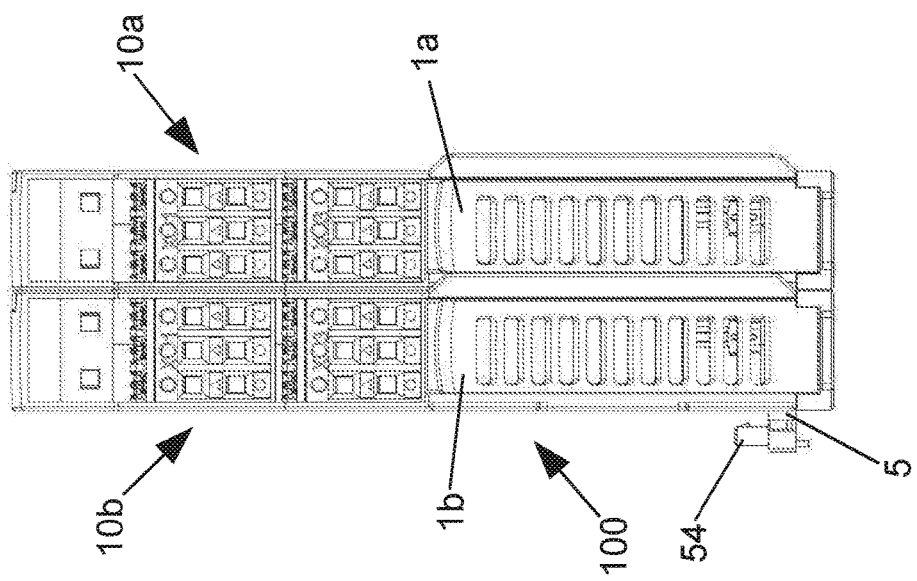
FIG. 15 is a plan view of the system after the mounting process of the second electronic module.

When the second electronic module 10*b* is mounted, its carrier rail housing 1*b* is fastened to the carrier rail housing 1*a* of the first electronic module 10*a* and is displaced in such a way until the bus connector 5 of the first electronic module 10*a* snaps into the carrier rail receiving opening 3 of the carrier rail housing 1*b* of the second electronic module 10*b*. During the mounting process each of the two outer inclined surfaces 51, 52 of the bus connector 5, which is fixed on the carrier rail housing 1*a* of the first electronic module 10*a*, presses against one of the holding sections 44 of the two locking slides 4*a*, 4*b* of the carrier rail housing 1*b* of the second electronic module 10*b*. As a result, the locking slides 4*a*, 4*b* of the carrier rail housing 1*b* of the second electronic module 10*b* are displaced outwards in the axial direction and, in so doing, avoid the bus connector 5 and make it possible for the plug-in contacts 62 of the second row of plug-in contacts 61 of the plug-in contact element 6 of the second carrier rail housing 1b to be plugged into the connecting sockets 62 of the second row of connecting sockets 54 of the bus connector 5 of the carrier rail housing 1a of the first electronic module 10a. This situation is shown in FIG. 14.

In addition, a slight deformation of the bending beams 47 is associated in turn with this displacement movement of the two locking slides 4a, 4b of the carrier rail housing 1b of the second electronic module 10b to the exterior. During the deformation the locking projections 48 are firmly pressed into the locking receptacles 12 on the mounting side of the carrier rail housing 1b of the second electronic module 10b, but are still in engagement with the locking receptacles. This deformation of the bending beams 47 of the two locking slides 4a, 4b generates in turn a reset force, which acts in the direction of the carrier rail receiving opening 3 of the carrier rail housing 1b of the second electronic module 10b.

When the carrier rail housing 1b of the second electronic module 10b is located in its desired mounting position, in which the bus connector 5 of the first electronic module 10a has passed the two locking slides 4a, 4b of the second electronic module 10b and in which the plug-in contacts 62 of the second row of plug-in contacts 61 of the plug-in contact element 6 of the second electronic module 10b are plugged into the connecting sockets 56 of the second row of connecting sockets 54 of the bus connector 5 of the first electronic module 10a, the locking slides 4a, 4b of the second electronic module 10b move again in the direction of the carrier rail receiving opening 3 due to the reset force acting on the locking slides. The holding sections 44 on the free ends of the locking slides 4a, 4b of the second electronic module 10b extend beyond the free ends of the bus connector 5 of the first electronic module 10a such that the bus connector 5 of the first electronic module 10a is also fixed in its desired mounting position by the two locking slides 4a, 4b of the second electronic module 10b. The bending beams 47 of the locking slides 4a, 4b of both electronic modules 10a,10b generate only the holding force in the locking position.

A third electronic module 10c can be mounted on the second electronic module 10b in an analogous manner, in order to hold a system 100, in particular, a control system, as shown in FIGS. 17 and 18. In the present embodiment the third electronic module 10c forms a final module of the system 100 and, therefore, does not comprise a bus connector 5, in order to connect to an additional electronic module. Instead, the third electronic module 10c comprises a termination plug 13, which can be mounted in the carrier rail receiving opening 3 of the carrier rail housing 1c of the third electronic module 10c. In terms of design the termination plug 13 differs from the bus connectors 5, inter alia, in that it comprises only one row of connecting sockets 130. In principle, it is possible to design the termination plug 13 with or without electrical function. After the mounting process, the termination plug 13 is secured by the locking slides 4a, 4b of the third electronic module 10c and is also held in the carrier rail receiving opening 3 preferably such that it cannot be detached.

The assembly of the individual electronic modules 10a, 10b, 10c into a deliverable system 100 can be automated in an advantageous way. Following completion of the assembly process of the three electronic modules 10a, 10b, 10c, the system 100, shown in FIGS. 16 and 17, forms a stable unit that is ready to ship and that can be easily mounted on a carrier rail 2. The electrical and mechanical connection of the electronic modules 10a, 10b, 10c to one another is so stable that the entire handling of the system 100 from the pre-assembly at the manufacturer to the final assembly on the carrier rail 2 is possible without the use of additional support structures to hold the electronic modules 10a, 10b, 10c. As a result, the system 100 that is already pre-configured at the manufacturer can be attached to the carrier rail 2 as a pre-assembled and pre-configured unit without a disassembly into the individual electronic modules 10a, 10b, 10c. The details of the mounting process of the system 100 on the carrier rail 2 shall be explained in greater detail below with reference to FIGS. 18 to 23.

Figure 20:
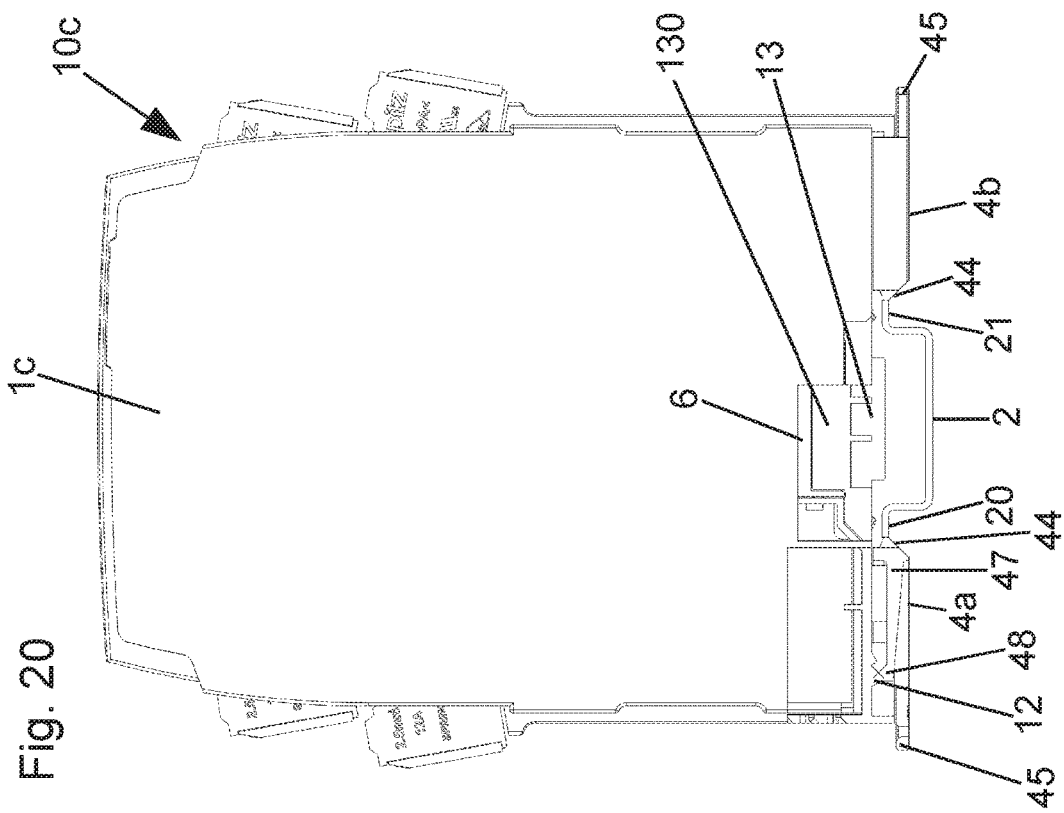
FIG. 20 is a side view of the system in accordance with FIG. 16 during the mounting process on the carrier rail.
Figure 19:
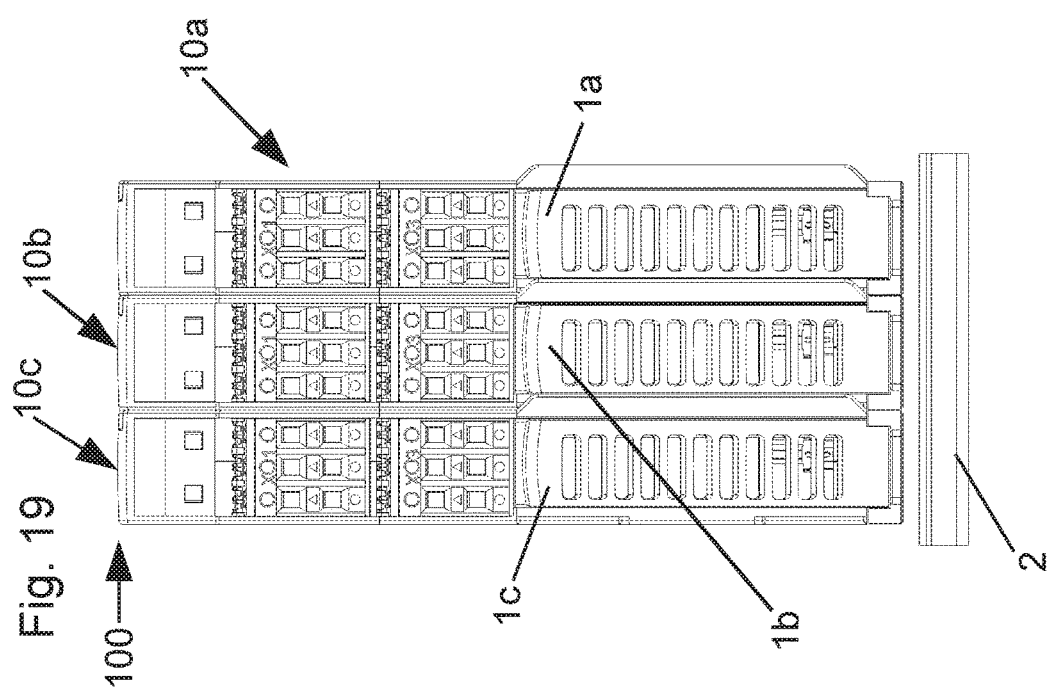
FIG. 19 is a plan view of the system in accordance with FIG. 16 prior to the mounting process on the carrier rail.
Figure 22:
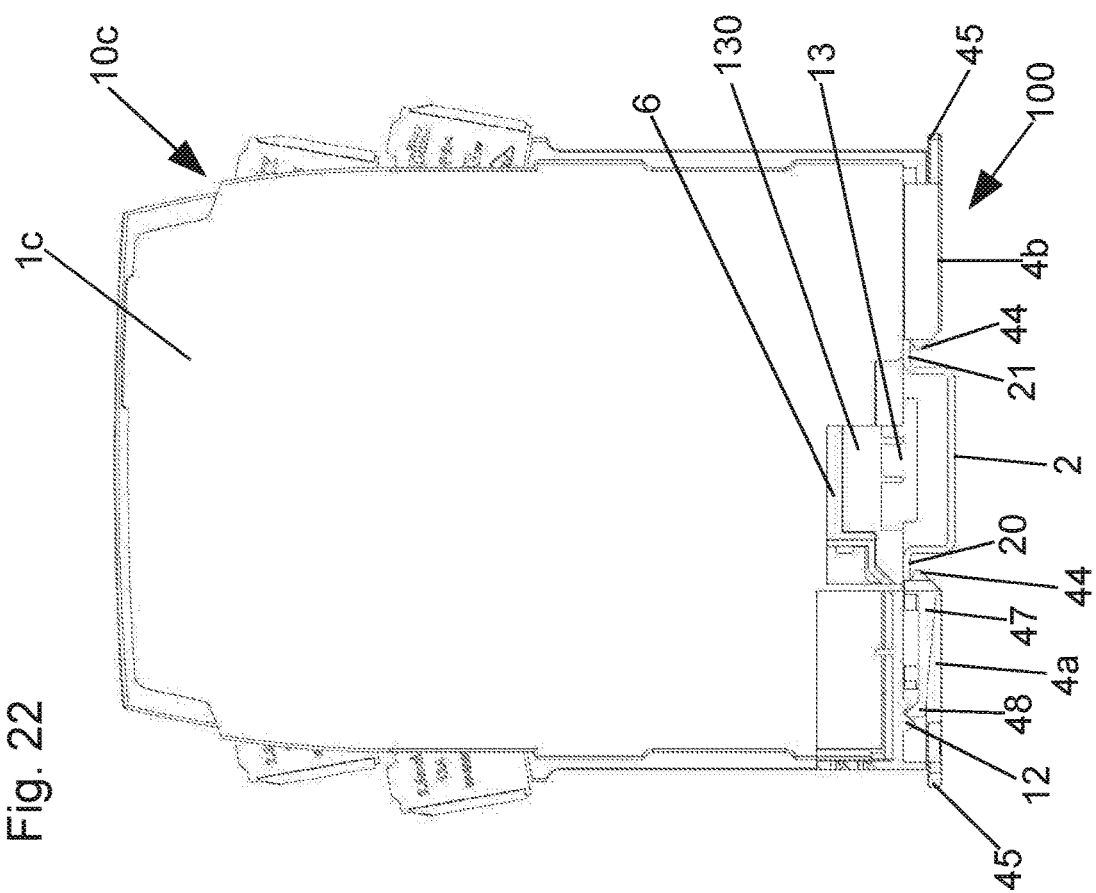
FIG. 22 is a side view of the system in accordance with FIG. 16 after the mounting process on the carrier rail.
Figure 21:
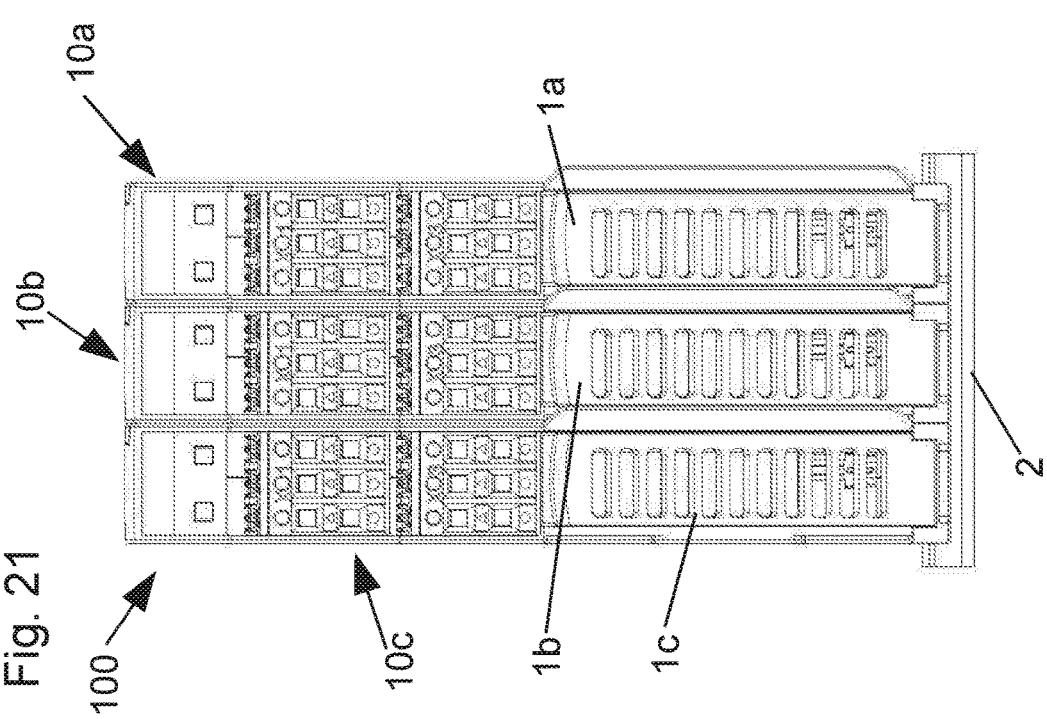
FIG. 21 is a plan view of the system in accordance with FIG. 16 during the mounting process on the carrier rail.
Figure 23:
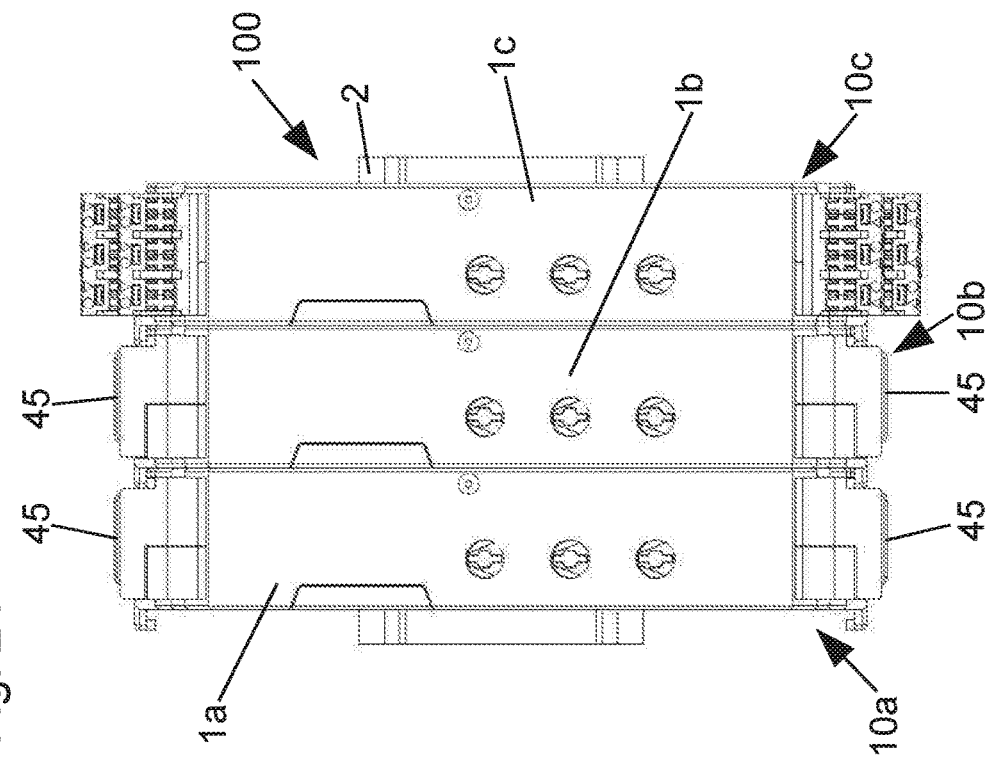
FIG. 23 is a plan view of the system in accordance with FIG. 16 after the mounting process on the carrier rail.

In the present embodiment the carrier rail 2 is a DIN profile rail and comprises two outwards bent holding sections 20, 21, which extend in the longitudinal direction of the carrier rail 2. When the system 100 is being mounted, the holding sections can engage with the carrier rail receiving openings 3 of the carrier rail housings 1a, 1b, 1c of the electronic modules 10a, 10b, 10c and can be fixed therein. In this case the system 100 can be mounted on the DIN rail 2 in a single step. When the holding legs 20, 21 are inserted into the carrier rail receiving openings 3 of the carrier rail housings 1a, 1b,1c, the holding legs 20, 21 engage with their free ends on the holding sections 44 of the locking slides 4a, 4b of the carrier rail housings 1a, 1b, 1c. As a result, the locking slides 4a, 4b of all of the carrier rail housings la, 1b, 1c are moved outwards in the axial direction and avoid the holding legs 20, 21 of the DIN rail 2. This situation is shown in FIG. 20. In addition, a slight deformation of the bending beams 47 of all of the locking slides 4a, 4b is associated with this displacement movement of the two locking slides 4a, 4b of the carrier rail housings 1a, 1b, 1c to the exterior. During the deformation the locking projections 48 of the bending beams 47 are firmly pressed into the locking receptacles 12 on the mounting side of the carrier rail housings 1a, 1b, 1c, but are still in engagement with the locking receptacles. This deformation of the bending beams 47 of the locking slides 4a, 4b generates a reset force, which acts in the direction of the carrier rail receiving opening 3 of the carrier rail housings 1a, 1b, 1c of the electronic modules 10a, 10b, 10c. When the holding legs 20, 21 of the carrier rail 2 have passed the locking slides 4a, 4b of the carrier rail housings 1a, 1b, 1c, the locking slides 4a, 4b move again in the direction of the carrier rail receiving openings 3 of the carrier rail housings 1a, 1b, 1c due to the reset force acting on the locking slides. Thus, in the desired mounting position of the carrier rail 2, the holding legs 20, 21 extend between the holding sections 44 of the locking slides 4a, 4b of the first and second electronic module 10a, 10b and the bus connectors 5 of the first and second electronic module 10a, 10b or, respectively, between the holding sections 44 of the locking slides 4a, 4b and the termination plug 13 of the third electronic module 10c. In this way the system 100 is fixed on the carrier rail 2 in a locking manner. Moreover, in the desired mounting position, in which the bending beams 47 of the locking slides 4a, 4b generate only their holding force, the grounding springs 63, 64 of the plug-incontact elements 6 of all of the electronic modules 10a, 10b, 10c contact the holding legs 20, 21 of the carrier rail 2.

As an alternative to the assembly process explained above, the system 100 can also be mounted on one side of the carrier rail 2 and can then be swiveled in, in order to transfer the holding legs 20, 21 of the carrier rail 2 into their desired mounting position, in which the holding legs extend between the holding sections 44 of the locking slides 4a, 4b and the bus connectors 5 of the first and second electronic module 10a, 10b or, respectively, between the holding sections 44 of the locking slides 4a, 4b and the termination plug 13 of the third electronic module 10c.

Figure 24:
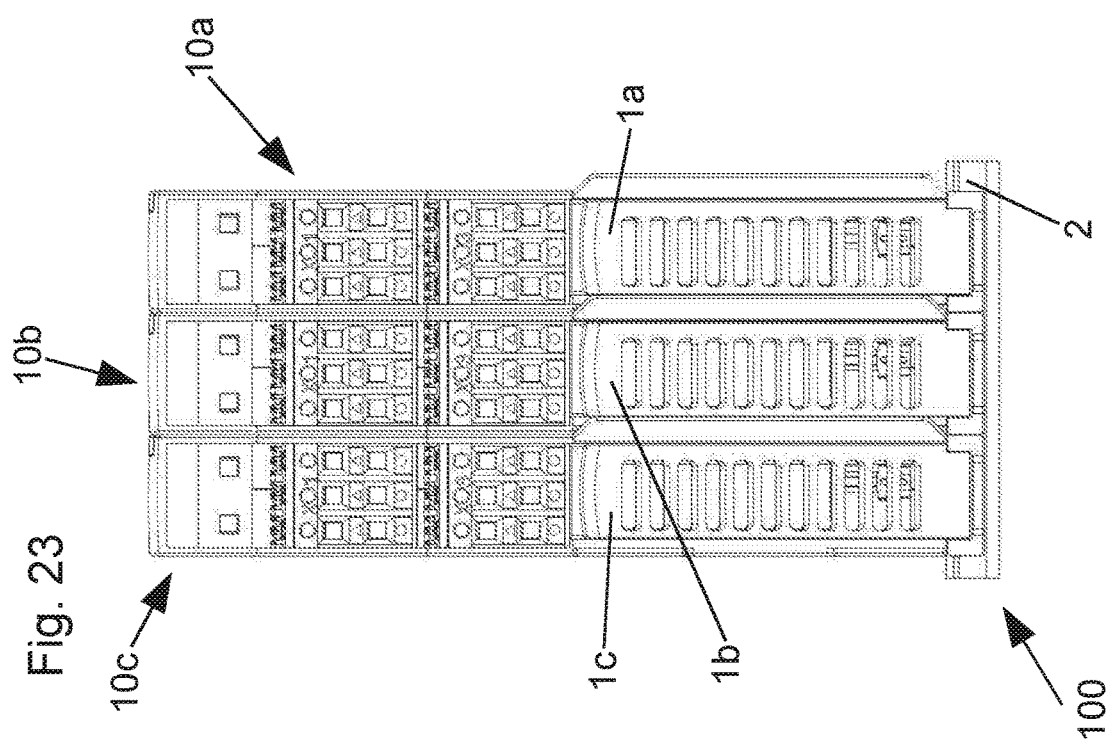
FIG. 24 is a frontal view of the system prior to a disassembly of one of the electronic modules from the carrier rail.

After the system 100 has been mounted on the carrier rail 2, it is also possible, in principle, to disassemble again individual electronic modules 10a, 10b, 10c without having to remove the entire system 100 from the carrier rail 2 for this purpose. With reference to FIGS. 24 to 26, the disassembly of one of the electronic modules 10a, 10b, 10c shall be explained in greater detail below. FIG. 24 shows in turn a system 100, which comprises three electronic modules 10a, 10b, 10c that are connected to one another electrically and mechanically by two bus connectors 5 in the manner described above.

In order to be able to disconnect the second electronic module 10b, which is disposed in the middle of the system 100 between the first electronic module 10a and the third electronic module 10c, from the carrier rail 2, the two locking slides 4a, 4b of the second electronic module 10b are first transferred outwards into an unlocking position. For this purpose it is possible to use, for example, a screwdriver, which is inserted in succession into the engagement openings 46 of the handling sections 45 of the mutually opposite locking slides 4a, 4b of the second electronic module 10b, in order to move the locking slides outwards, so that the locking projections 48, which are formed on the bending beams 47 of the locking slides 4a, 4b of the second electronic module 10b, no longer engage with the associated locking receptacles 12 on the mounting side of the carrier rail housing 1b of the second electronic module 10b and, as a result, release the carrier rail housing 1b. Then the relevant carrier rail housing 1b can be removed, as can be seen in FIG. 25, from the carrier rail 2 towards the front. The first electronic module 10a and the third electronic module 10c remain mounted on the carrier rail 2 and, in addition, hold the two bus connectors 5 in their position. Subsequently an electronic module without bus connectors 5, which is supposed to replace the second electronic module 10b and comprises the corresponding locking slides 4a, 4b, can be mounted in the manner described above on the two bus connectors 5, which are attached to the carrier rail housings 1a, 1c of the first and third electronic module 10a, 10c. As an alternative, it is also possible to move the first electronic module 10a and the third electronic module 10c on the carrier rail 2 further outwards, so that two or more electronic modules, which are connected to one another with one bus connector 5 each, can be fixed on the carrier rail 2 between the first electronic module 10a and the third electronic module 10c. After the second electronic module 10b has been replaced by one or more electronic modules, the system 100 is immediately ready to operate again.

Hence, the fixing and connecting concept described herein also enables in a simple way a subsequent expansion of the system 100, attached to the carrier rail 2, without having to completely disassemble the system from the carrier rail 2 for this purpose.

What is claimed is:

1. A carrier rail housing suitable for attaching to a carrier rail including two holding legs that extend in the longitudinal direction and face outwards, the carrier rail housing comprising:
   a carrier rail receiving opening into which the holding legs of the carrier rail are insertable;
   a locking mechanism to secure the holding legs in a desired mounting position inside the carrier rail receiving opening, the locking mechanism comprising two locking slides arranged to be displaceable on a mounting side of the carrier rail housing and configured to be interlocked with the carrier rail housing in a locking position;
   at least one plug-in contact element arranged inside the carrier rail housing so as to face in the direction of the carrier rail receiving opening, the plug-in contact element including a plurality of plug-in contacts; and
   at least one bus connector into which at least some of the plug-in contacts of the plug-in contact element are insertable, the at least one bus connector being connectable to a plug-in contact element of at least one additional carrier rail housing, wherein the bus connector comprises a base body with two mutually opposite ends, on each of which an inclined surface is formed, wherein the inclined surfaces are configured to move the locking slides outwards when the bus connector is inserted into the carrier rail receiving opening of the carrier rail housing,
   wherein each of the locking slides comprises a first end that comprises a holding section that extends in sections into the carrier rail receiving opening in the locking position, so that the bus connector is secured between the holding sections of the locking slides and the plug-in contact element inside the carrier rail receiving opening.

2. The carrier rail housing of claim 1, wherein each of the locking slides comprises a locking element and the carrier rail housing further comprises two locking recesses, wherein in the locking position of the locking slides, one of the locking elements engages with each of the two locking recesses.

3. The carrier rail housing of claim 2, wherein each of the locking elements comprise:
   bending beams that extend from the holding section in the direction of a second end of an associated one of the locking slides; and
   a locking projection to engage with the locking recess associated with the locking slide in the locking position.

4. The carrier rail housing of claim 3, wherein each of the bending beams is configured such that when the locking slide is displaced outwards away from the carrier rail receiving opening, the bending beam generates in interaction with the locking recess, with which the locking projection engages, a reset force that acts on the locking slide in the direction of the carrier rail receiving opening.

5. The carrier rail housing of claim 1, wherein in the desired mounting position of the carrier rail, the holding legs extend between the bus connector and the holding sections of the locking slides.

6. The carrier rail housing of claim 1, wherein each of the locking slides comprises a handling section on a second end that is opposite the first end.

7. An electronic module, comprising:
   the carrier rail housing of claim 1.

8. A control system comprising:
   a plurality of electronic modules, wherein at least one of the electronic modules is according to the electronic module of claim 7 and is electrically and mechanically connected to an adjacent electronic module by the bus connector.

9. The control system of claim 8, wherein one of the electronic modules is a final module of the control system and comprises a termination plug.

* * * * *